(12) United States Patent
Yasuda

(10) Patent No.: US 6,780,705 B2
(45) Date of Patent: Aug. 24, 2004

(54) SEMICONDUCTOR DEVICE AND ITS MANUFACTURE

(75) Inventor: Makoto Yasuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/339,297

(22) Filed: Jan. 10, 2003

(65) Prior Publication Data

US 2003/0107064 A1 Jun. 12, 2003

Related U.S. Application Data

(62) Division of application No. 09/899,269, filed on Jul. 6, 2001, now Pat. No. 6,521,934.

(30) Foreign Application Priority Data

Mar. 28, 2001 (JP) .......................................... 2001-093672

(51) Int. Cl.[7] .......................................... H01L 21/8242
(52) U.S. Cl. ........................ 438/239; 438/244; 438/253; 438/396
(58) Field of Search ................................. 438/197, 241, 438/244, 253, 255, 258, 396, 398

(56) References Cited

U.S. PATENT DOCUMENTS 5,858,831 A 1/1999 Sung
6,215,142 B1 4/2001 Lee et al.
6,312,994 B1 11/2001 Nakamura

FOREIGN PATENT DOCUMENTS

JP 10-214894 8/1998

Primary Examiner—Tuan H. Nguyen
Assistant Examiner—David S. Blum
(74) Attorney, Agent, or Firm—Westerman, Hattori, Daniels & Adrian, LLP

(57) ABSTRACT

A semiconductor device having: a semiconductor substrate having first and second regions defined in a principal surface of the semiconductor substrate; a first underlying film formed in the second region; a first lamination structure formed in a partial area of the first region, the first lamination structure having a conductive film and an insulating film stacked in this order from the substrate side; and a second lamination structure formed on the first underlying film and having a conductive film and an insulating film stacked in this order from the substrate side, wherein the insulating films of the first and second lamination structures are made of the same material and the height of the upper surface of the second lamination structure as measured from the principal surface of the semiconductor substrate is equal to or lower than the height of the upper surface of the first lamination structure as measured from the principal surface of the semiconductor substrate. Plug electrodes of a SAC structure are prevented from being electrically shorted when a plurality of elements having different heights are formed on the same substrate.

15 Claims, 24 Drawing Sheets

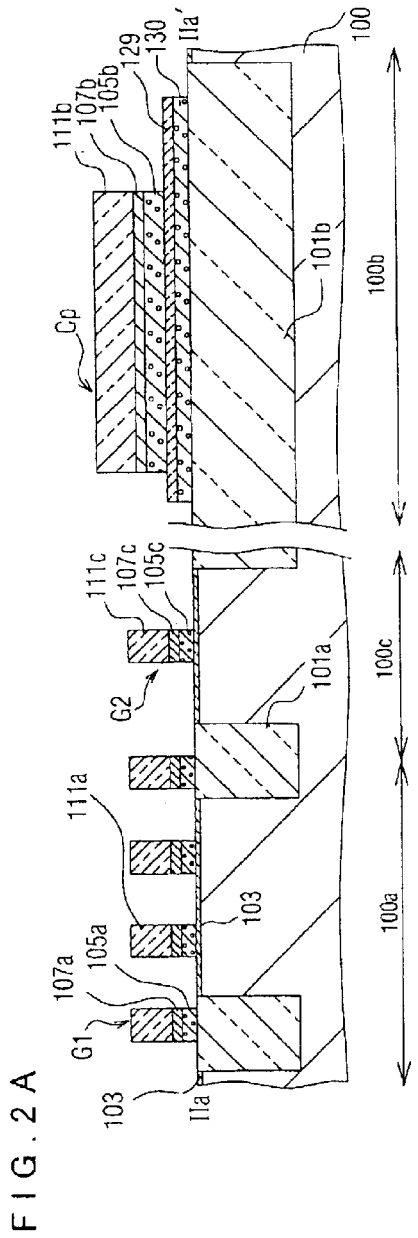
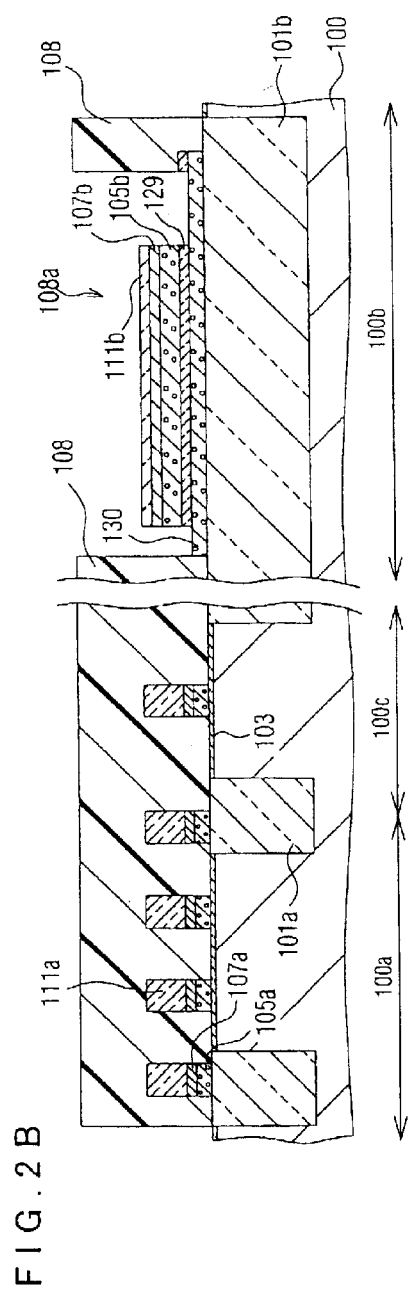
FIG. 2A
FIG. 2B

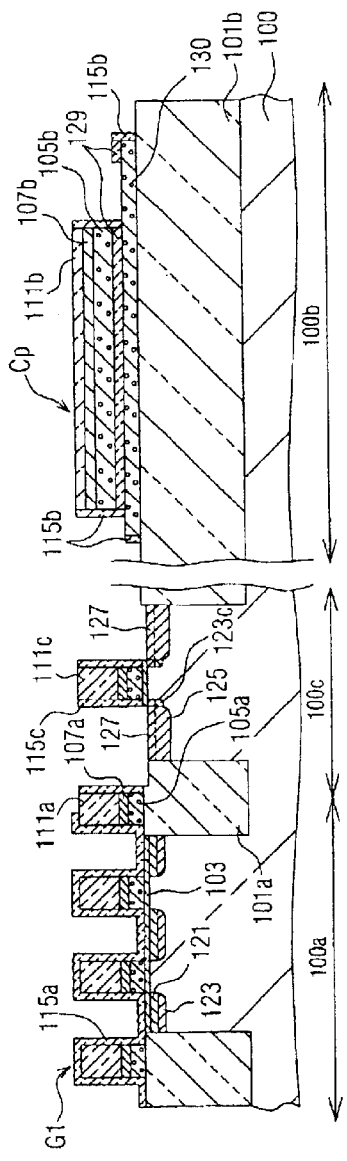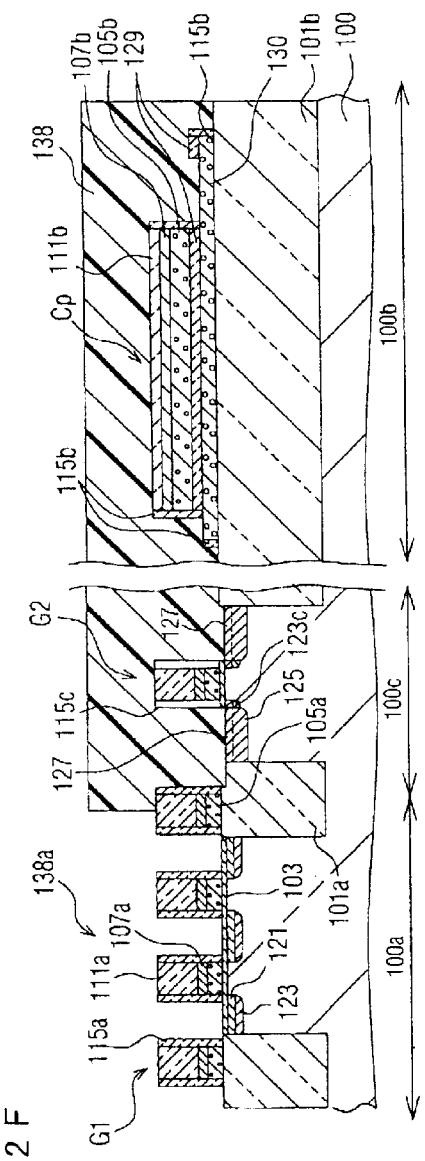

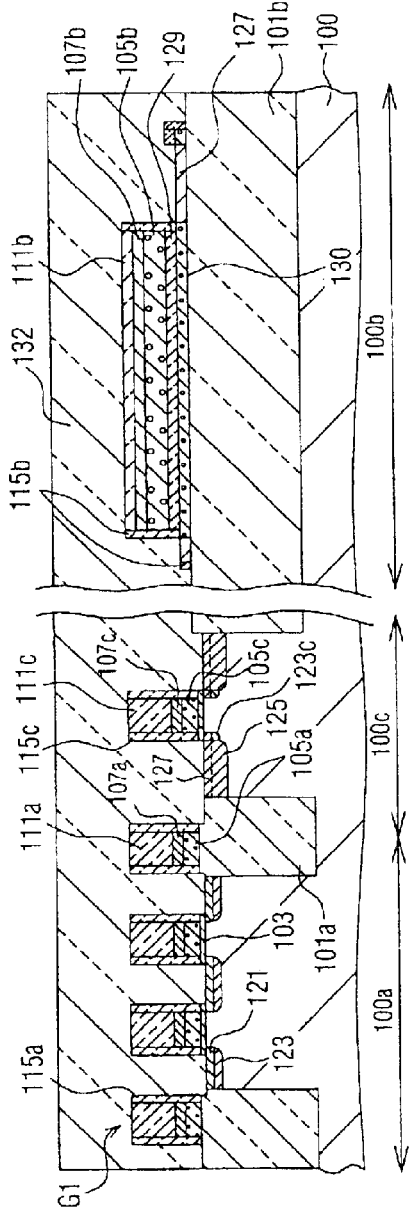
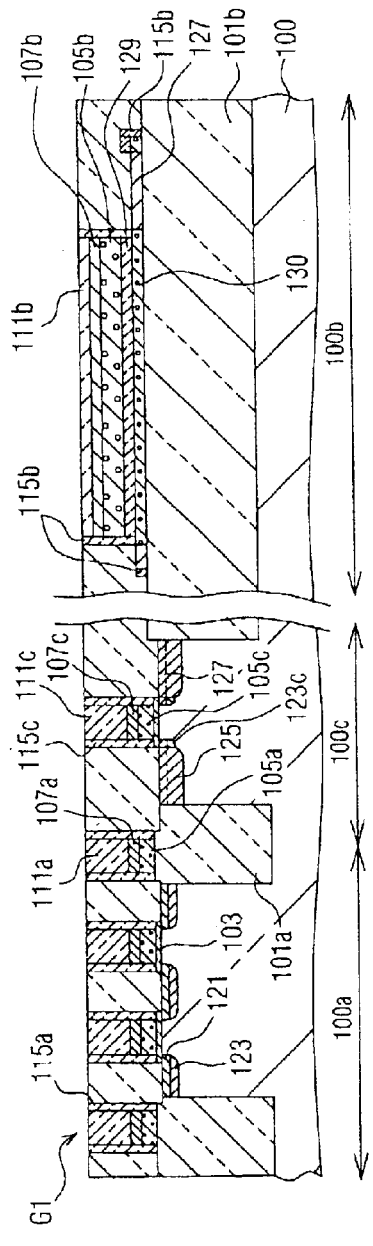

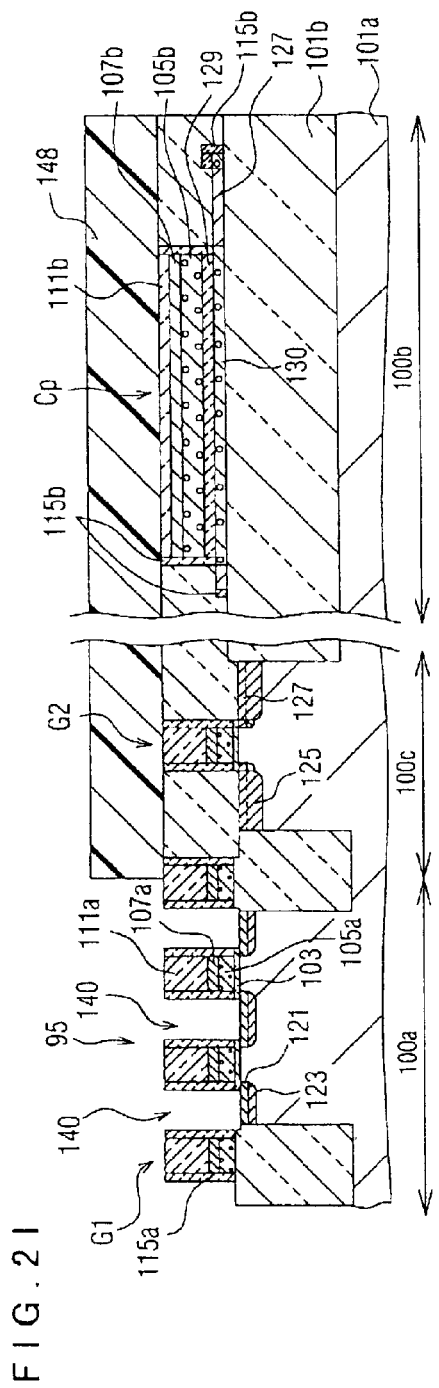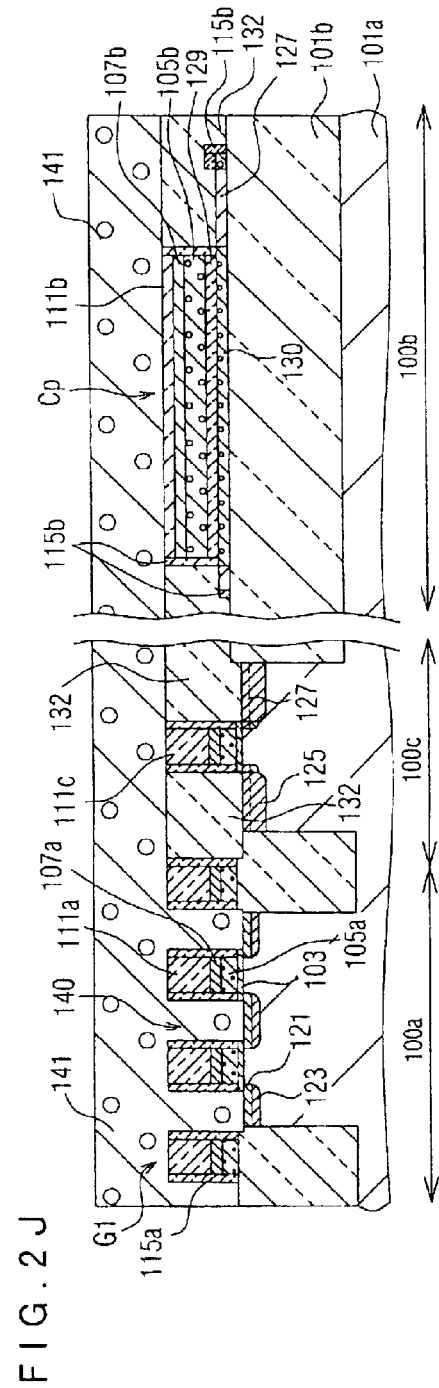

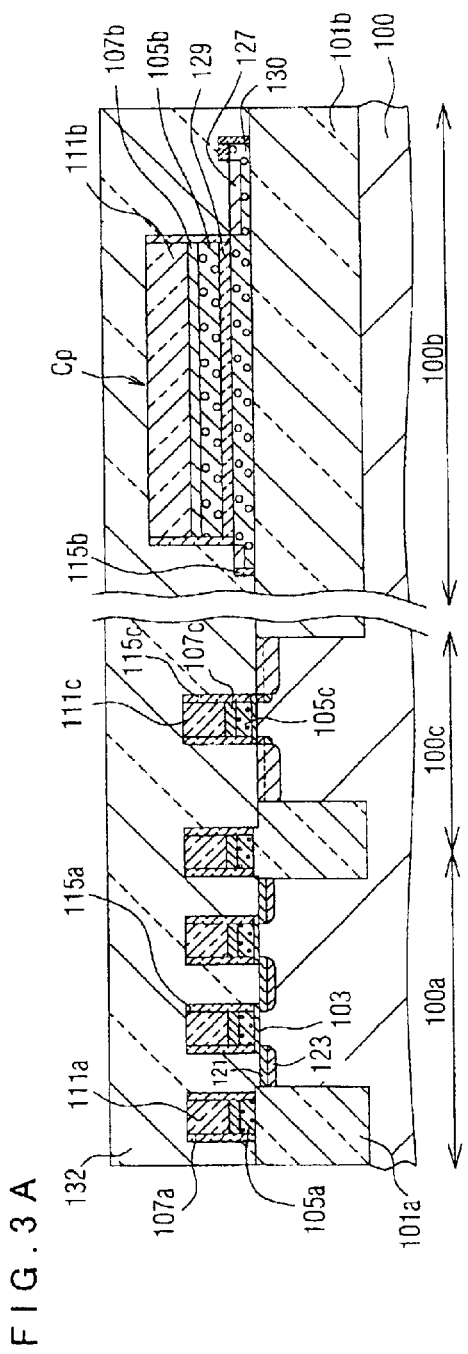
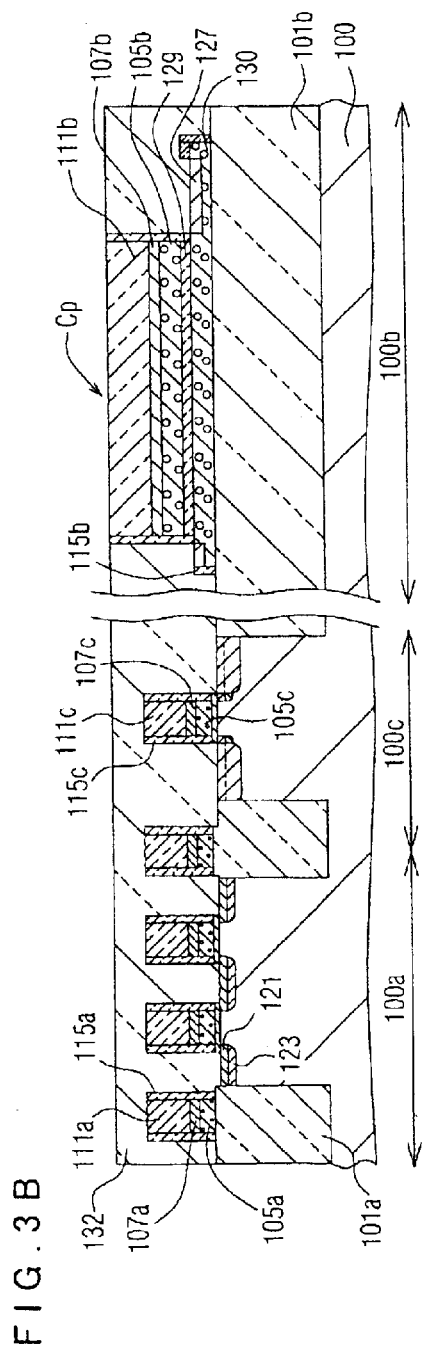
FIG. 3A
FIG. 3B

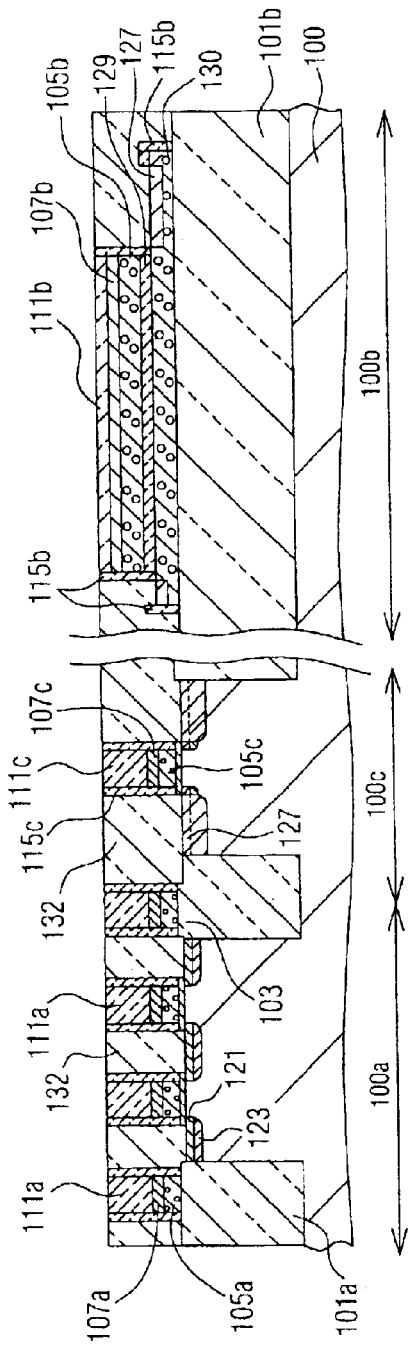
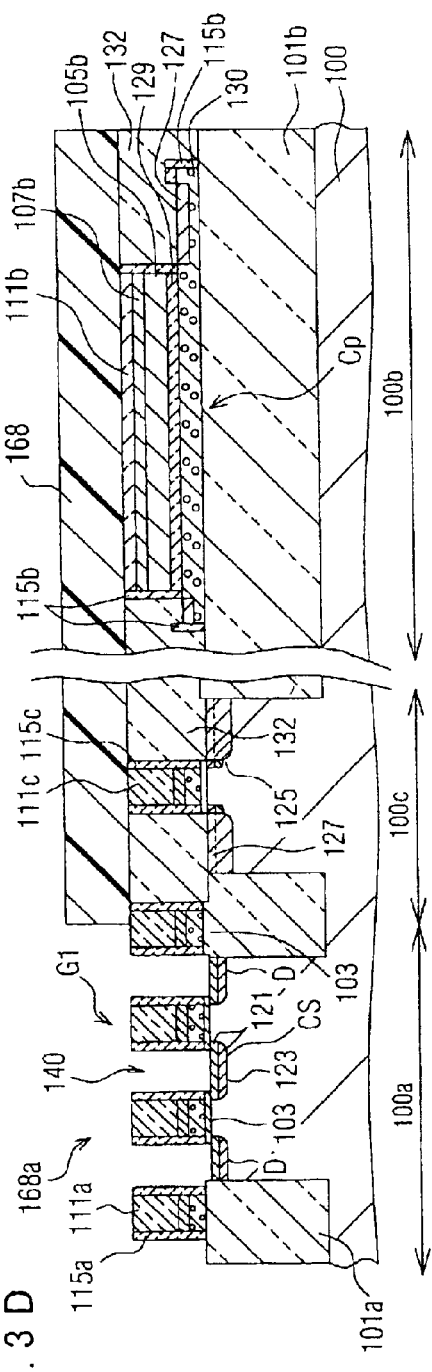
FIG. 3C
FIG. 3D

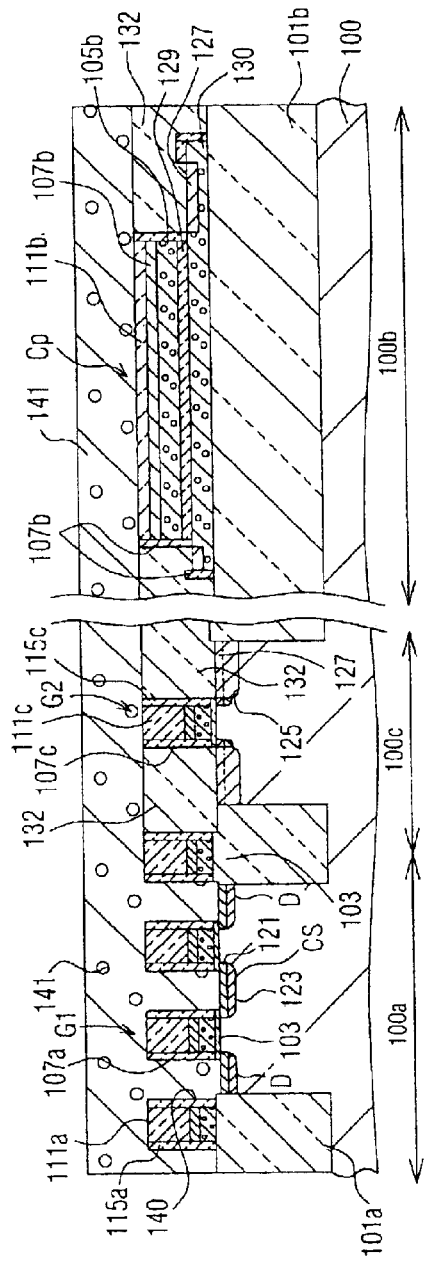
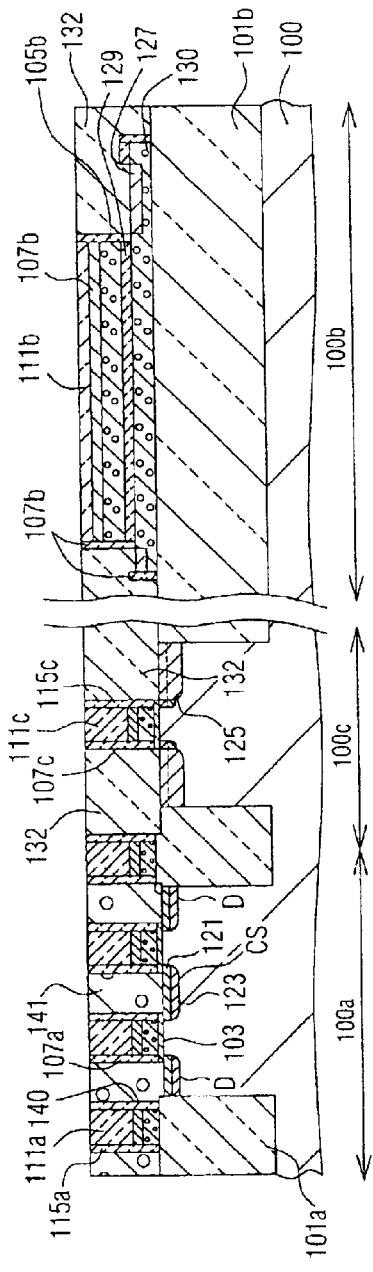
FIG. 3E
FIG. 3F

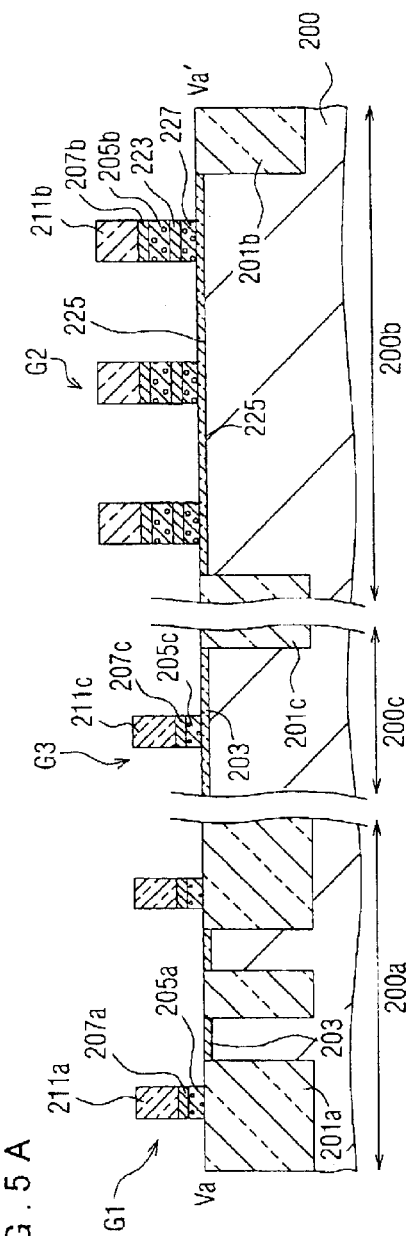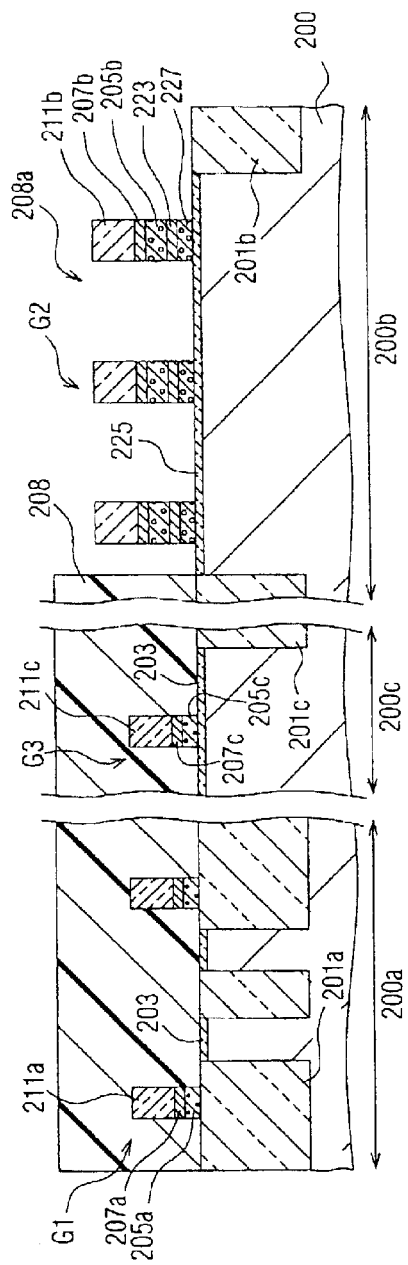
FIG. 5A
FIG. 5B

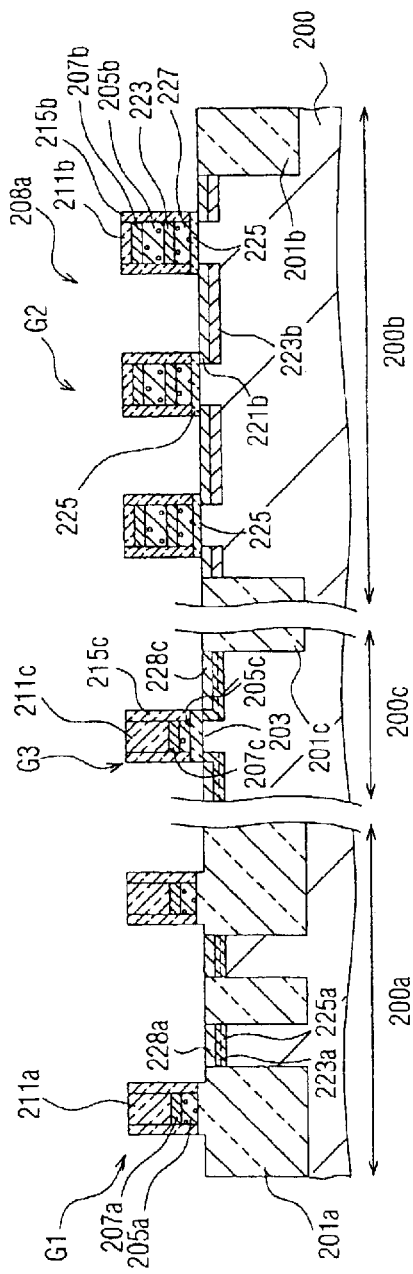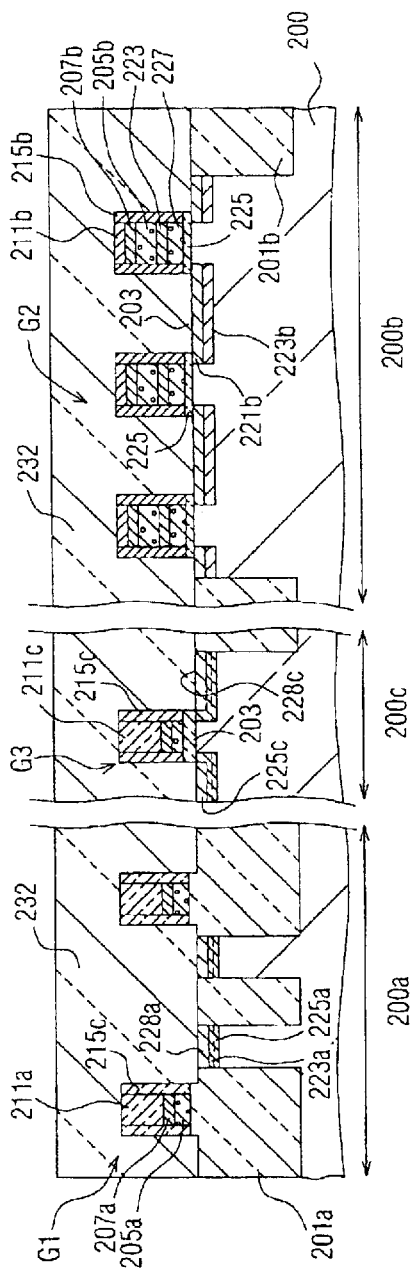

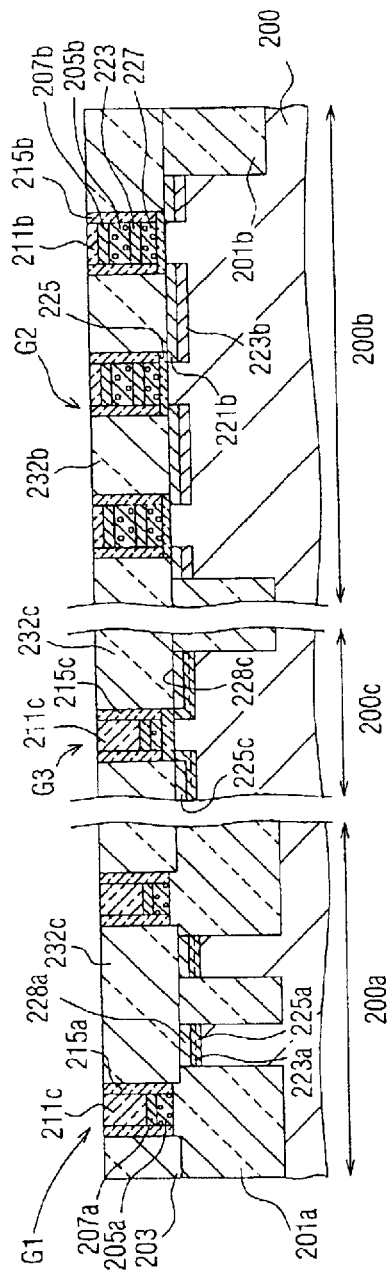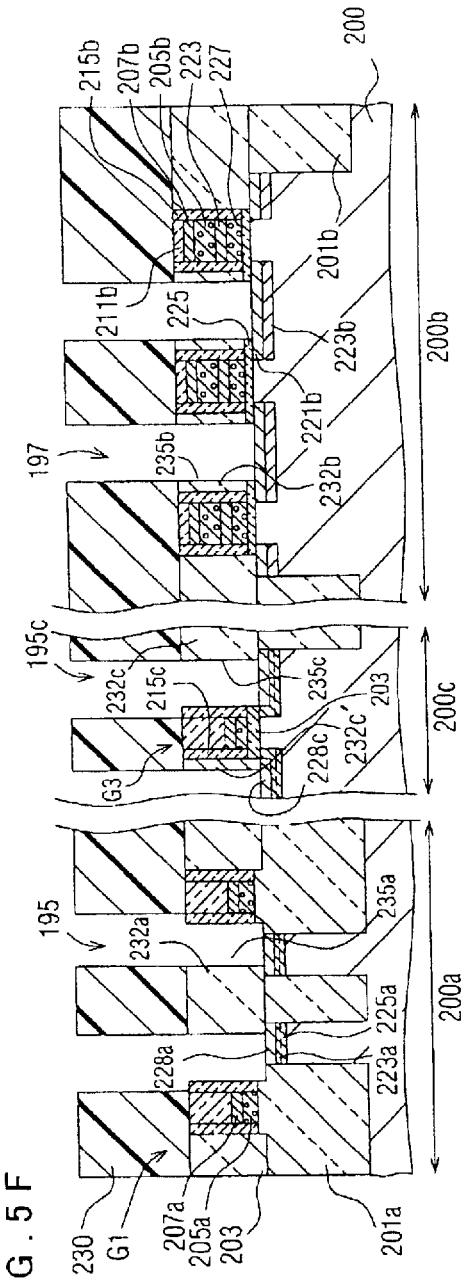

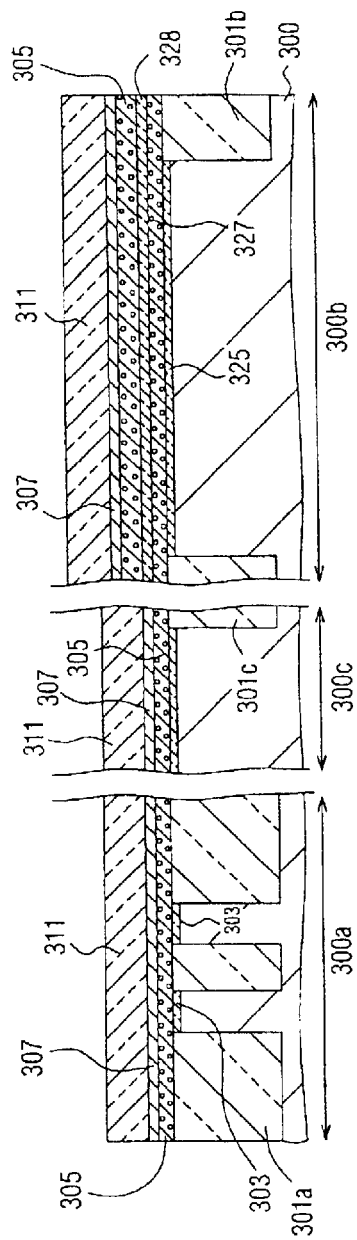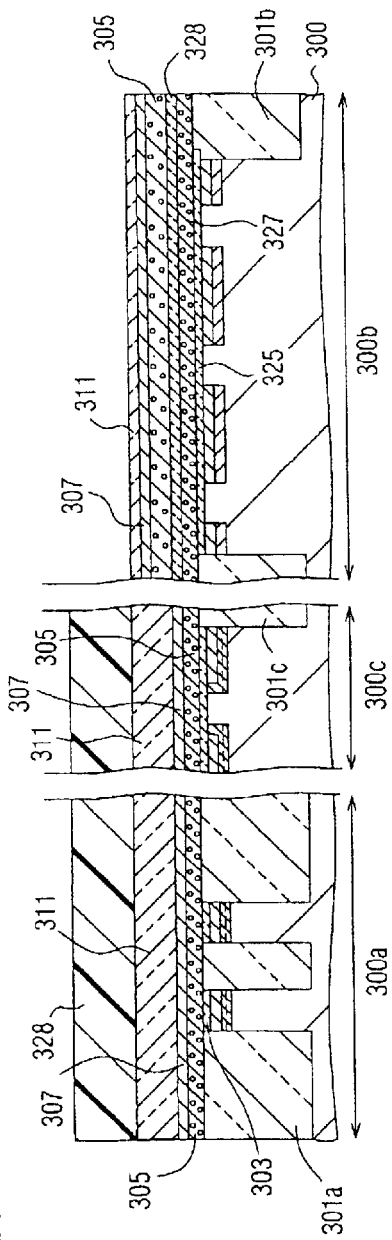
FIG. 6A
FIG. 6B

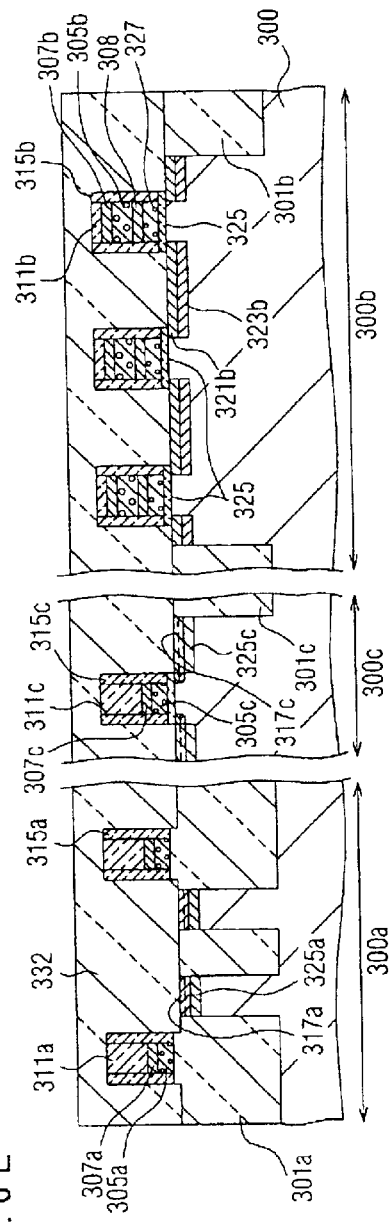
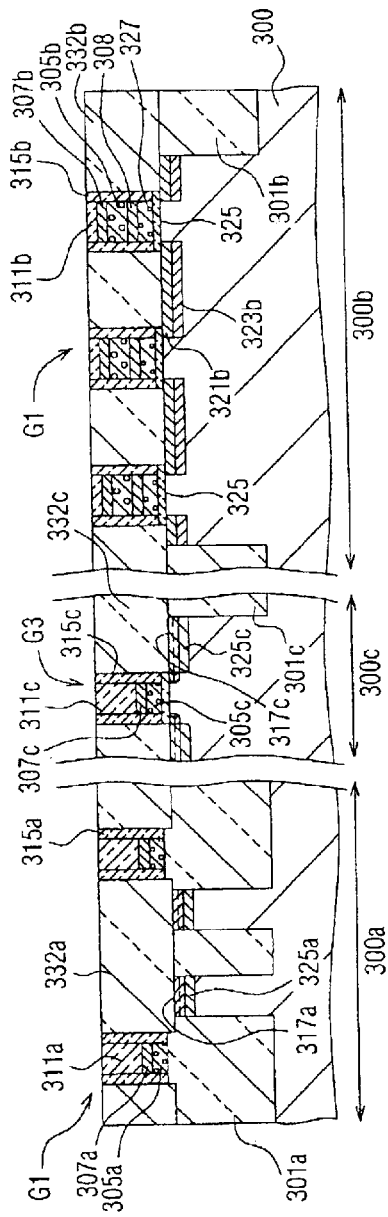

SEMICONDUCTOR DEVICE AND ITS MANUFACTURE

This application is a divisional of application Ser. No. 09/899,269, filed Jul. 6, 2001, now U.S. Pat. No. 6,521,934, which claims foreign priority benefits of Japanese application 2001-093672, filed Mar. 28, 2001

BACKGROUND OF THE INVENTION a) Field of the Invention

The present invention relates to semiconductor devices and their manufacture methods, and more particularly to semiconductor techniques of forming different elements on the same substrate, the elements including DRAM memory cells and SRAM memory cells with MOSFET's, and analog capacitors and flash memories.

b) Description of the Related Art

In this specification, an offset insulating film is intended to mean an insulating film (cap layer) formed on a conductive layer and having the same shape as viewed in plan as that of the conductive layer. The conductive layer may have a multi-layer structure or the offset insulating film may have a multi-layer structure. In this specification, the terms "lamination structure" or "lamination structural body" are intended to mean a structural body including a lamination structure (structural body) of an electrode and an insulating film such as an offset film formed on the electrode. An element region is intended to mean a region containing at least one active region therein. The principal surface of a semiconductor substrate is a two-dimensional surface and its surface irregularity such as concave and convex poses almost no practical problem. A "height" is intended to mean a height measured from such a two-dimensional surface along a direction normal to the surface.

Recent large scale of semiconductor integration circuits requires micro-fine semiconductor elements. In order to realize a semiconductor integrated circuit having gate electrodes, wirings and contact holes more smaller in size, resolution of photolithography has been improved heretofore by using exposure light of a shorter wavelength.

Device structures have been studied which can reduce a minimum image resolution size as well as a position alignment margin between lithography processes. As one example of such device structures, a self-align contact (hereinafter called SAC) structure is known.

FIG. 7 is a cross sectional view showing the outline structure of SAC. As shown in FIG. 7, an element isolation region 501 is defined in a silicon substrate 500. A number of lamination structural bodies G1 are formed on the silicon substrate 500 on the element isolation region 501 and in an area away from the region 501 by some distance. The lamination structural body G1 is formed on a gate insulating film 503 and has the lamination structure made of a gate electrode layer 505, a barrier metal layer 507 and an offset insulating film 511. In the following description, a lamination of the gate electrode layer 505, barrier metal layer 507 and offset insulating film 511 is called the lamination structural body G1. Spacer films (side wall insulating films) 515 are formed on the side walls of the lamination structural body G1.

Contact holes are formed between mutually adjacent lamination structural bodies G1, being sandwiched between the spacer films 515 formed on the side walls of the lamination structural bodies G1. In each contact hole, a plug electrode 521 of doped amorphous silicon is formed. The bottom surface of the plug electrode 521 is in contact with the surface of the silicon substrate 500. The plug electrode 521 connects together, for example, an upper structure to be formed above the lamination structural body G1 and a lower structure to be formed in the silicon substrate 500.

The upper surface of the plug electrode 521 can be made generally flush with the upper surface of the offset insulating film 511, for example, by a chemical mechanical polishing (CMP) method.

If SAC techniques are incorporated, the plug electrode 521 can be formed in a self alignment manner between adjacent lamination structural bodies G1. A position alignment margin can therefore be increased between a contact hole forming process and a plug electrode forming process.

With developments on semiconductor integrated circuit techniques, it is possible to realize a so-called system LSI in which one or more systems are formed in one semiconductor chip by forming various types of integrated circuits.

A system LSI has various types of IC's formed therein, including a logic IC cell part, a memory cell part (such as dynamic random access memory (DRAM), static random access memory (SRAM) and flash memory), an analog cell part and the like. In order to form such various IC's and reduce an area occupied by these IC's, SAC techniques are becoming more and more important. It is an important point that micro-fineness and high reliability of a system LSI rely on how the heights of upper surfaces of offset insulating films are made flush in respective IC's in the silicon substrate plane.

Problems which occur when a memory cell part and an analog cell part are formed on the same substrate will be described with reference to FIGS. 8A to 8E, by taking as examples a DRAM cell part and an analog capacitor part.

As shown in FIG. 8A, first and second element regions 400a and 400b are defined in a silicon substrate 400. In the first element region 400a, a DRAM cell part is formed having a number of lamination structural bodies (word lines) G1. The structure of the DRAM cell part is similar to the SAC structure shown in FIG. 7. In the second element region 400b, an analog capacitor part is formed having an analog capacitor element Cp.

A gate oxide film 403 is formed on the surface of the first element region 400a. On the gate oxide film 403, a first lamination structural body G1 is formed including a lamination of a gate electrode layer 405a, a barrier metal layer 407a and an offset insulating film 411a. Spacer films (side wall insulating films) 415a are formed on the side walls of each lamination structural body G1.

The analog capacitor element Cp formed in the second element region 400b includes a lower electrode 430, a dielectric layer 429 and a second lamination structural body. The second lamination structural body has a three-layer structure including an upper electrode 405b, a barrier metal layer 407b and an offset insulating film 411b. Spacer films 415b are formed on the side walls of the lower electrode 430, dielectric layer 429 and second lamination structural body. The gate electrode layer 405a, barrier metal layer 407a and offset insulating film 411a are formed by the common layers to those of the upper electrode 405b, barrier metal layer 407b and offset insulating film 411b.

The height of the upper surface of the offset insulating film 411b in the analog capacitor part as measured from the upper surface of the silicon substrate 400 is higher than the height of the upper surface of the offset insulating film 411a in the DRAM cell part by an amount corresponding to a thickness of the lower electrode 430 and dielectric layer 429 (both collectively called a lower structure).

Interlayer insulating films 410a and 410b are formed over the silicon substrate 400, covering the lamination structural bodies G1 and analog capacitor element Cp and having the etching characteristics different from the offset insulating films 411a and 411b. Although the interlayer insulating film 410a is formed in the first element region 400a and the interlayer insulating film 410b is formed in the second element region 400b, these interlayer insulating films are made of the same layer. The upper surface of the interlayer insulating film 410a is lower than the upper surface of the interlayer insulating film 410b. Under the etching conditions that the interlayer insulating films can be selectively etched relative to the offset insulating films, the interlayer insulating films 410a and 410b are polished from their upper surfaces by CMP. CMP automatically stops when the upper surface of the offset insulating film 411b is exposed.

As shown in FIG. 8B, the upper surfaces of the interlayer insulating films 410a and 410b are generally flush in the first and second element regions 400a and 400b.

As shown in FIG. 8C, a resist mask 435 is formed covering the second element region 400b and a partial area of the first element region 400a although not shown in FIG. 8C. The resist mask 435 has an opening in the first element region 400a shown in FIG. 8C, the opening extending along a direction in parallel to the drawing sheet. By using the resist mask 435 as an etching mask, the interlayer insulating film 410a in the first element region 400a is etched. Contact holes 440 are therefore formed between the lamination structural bodies G1, reaching the surface of the silicon substrate 400. The resist mask 435 is thereafter removed.

As shown in FIG. 8D, impurity doped amorphous silicon layers 431a and 431b are deposited in the first and second element regions 400a and 400b to a height higher than the upper surfaces of the lamination structural bodies G1 and analog capacitor element Cp. The amorphous silicon films 431a and 431b are polished by CMP or the like from the upper surfaces thereof. CMP stops when the upper surface of the offset insulating film 411b is exposed. As shown in FIG. 8E, the amorphous silicon film 431a is left on the offset insulating films 411a. The amorphous silicon film 431a for plug electrodes cannot be electrically separated by the lamination structural bodies G1 in the first element region 400a and the SAC structure cannot be formed.

Such a phenomenon occurs when elements having the SAC structure and elements whose upper surfaces are different in height from those of the offset insulating films of the SAC structure are formed on the same substrate.

SUMMARY OF THE INVENTION

It is an object of the present invention to provide semiconductor techniques of forming on the same substrate, elements having the SAC structure and elements whose upper surfaces are different in height from those of offset insulating films of the SAC structure, before a plug electrode forming process.

According to one aspect of the present invention, there is provided a semiconductor device comprising: a semiconductor substrate having first and second regions defined in a principal surface of said semiconductor substrate; a first lamination structure formed in a partial area of said first region of the principal surface of said semiconductor substrate, said first lamination structure having a conductive film and an insulating film stacked in this order from the side of the semiconductor substrate; a first underlying film formed in said second region of the principal surface of said semiconductor substrate; and a second lamination structure formed on said first underlying film and having a conductive film and an insulating film stacked in this order from the side of said semiconductor substrate, said insulating films of said first and second lamination structures being made of same material and a height of an upper surface of said second lamination structure as measured from the principal surface of said semiconductor substrate being equal to or lower than a height of an upper surface of said first lamination structure as measured from said principal surface of said semiconductor substrate.

The upper surface of the first lamination structure of the semiconductor device is an uppermost surface.

According to another aspect of the present invention, there is provided a method of manufacturing a semiconductor device, comprising steps of: (a) preparing a semiconductor substrate with first and second regions being defined in a principal surface of said semiconductor substrate; (b) forming a first underlying film in said second region of said semiconductor substrate; (c) forming a first conductive film on said first region and said first underlying film; (d) forming a first insulating film on said first conductive film; (e) patterning at least two layers including said first conductive film and said first insulating film to leave a first lamination structure on said semiconductor substrate in said first region and a second lamination structure on said first underlying film in said second region, said first lamination structure being made of a portion of said first conductive film and a portion of said first insulating film stacked one upon the other, and said second lamination structure being made of a portion of said first conductive film and a portion of said first insulating film; and (f thinning said second lamination structure so that an upper surface of said second lamination structure becomes flush with or lower than an upper surface of said first lamination structure.

According to another aspect of the invention, there is provided a method of manufacturing a semiconductor device, comprising steps of: (a) preparing a semiconductor substrate with first and second regions being defined in a principal surface of said semiconductor substrate; (b) forming a first underlying film in said second region of said semiconductor substrate; (c) forming a first conductive film on said first region and said first underlying film; (d) forming a first insulating film on said first conductive film; (e) thinning said first insulating film in said second region so that an upper surface of said first insulating film in said second region becomes flush with or lower than an upper surface of said first insulating film; and (f) patterning at least two layers including said first conductive film and said first insulating film to leave a first lamination structure on said semiconductor substrate in said first region and a second lamination structure on said first underlying film in said second region, said first lamination structure being made of a portion of said first conductive film and a portion of said first insulating film stacked one upon the other, and said second lamination structure being made of a portion of said first conductive film and a portion of said first insulating film.

According to the semiconductor device manufacture methods, the upper surface of said first lamination structure can be made an uppermost surface.

According to a further aspect of the present invention, there is provided a method of manufacturing a semiconductor device, comprising steps of: (a) preparing a semiconductor substrate with first and second regions being defined in a principal surface of said semiconductor substrate; (b) forming a first underlying film in said second region of said semiconductor substrate; (c) forming a first conductive film on said first region and said first underlying film; (d) forming a first insulating film on said first conductive film; (e) patterning at least two layers including said first conductive film and said first insulating film to leave a first lamination structure on said semiconductor substrate in said first region and a second lamination structure on said first underlying film in said second region, said first lamination structure being made of a portion of said first conductive film and a portion of said first insulating film stacked one upon the other, and said second lamination structure being made of a portion of the first conductive film and a portion of said first insulating film; (f) forming an interlayer insulating film on said principal surface of said semiconductor substrate, said interlayer insulating film covering said first and second lamination structure; (g) thinning said interlayer insulating film until an upper surface of said second lamination structure is exposed, under a first thinning condition that a ratio of a thinning speed of said first insulating film to a thinning speed of said interlayer insulating film is larger than 1; and (h) thinning said interlayer insulating film and said second lamination structure until an upper surface of said first lamination structure is exposed, under a second thinning condition without selectivity.

According to the semiconductor device manufacture method, the upper surfaces of said interlayer insulating film and second lamination structure can be made flush with the upper surface of said first lamination structure.

According to the semiconductor techniques of the invention, even if the heights of offset insulating films are different in the same substrate, said upper surface of said interlayer insulating film can be made flush with the upper surface of said offset insulating film. Even if contact plugs are formed by polishing, adjacent plugs are prevented from being electrically shorted. It is particularly effective for SAC structures wherein openings of a plug pattern are near at gate electrodes.

BRIEF DESCRIPTION OF THE DRAWINGS

FIGS. 2A to 2L are cross sectional views taken along line IIa–IIa' shown in FIG. 1 and illustrating manufacture processes for the semiconductor device of the first embodiment.

FIGS. 3A to 3F are cross sectional views illustrating manufacture processes for a semiconductor device according to a modification of the first embodiment.

FIGS. 5A to 5I are cross sectional views taken along line Va–VIa' shown in FIG. 4 and illustrating manufacture processes for the semiconductor device of the second embodiment.

FIGS. 6A to 6F are cross sectional views illustrating manufacture processes for a semiconductor device according to a modification of the second embodiment.

DETAILED DESCRIPTION OF THE PREFERRED EMBODIMENTS

Figure 1:
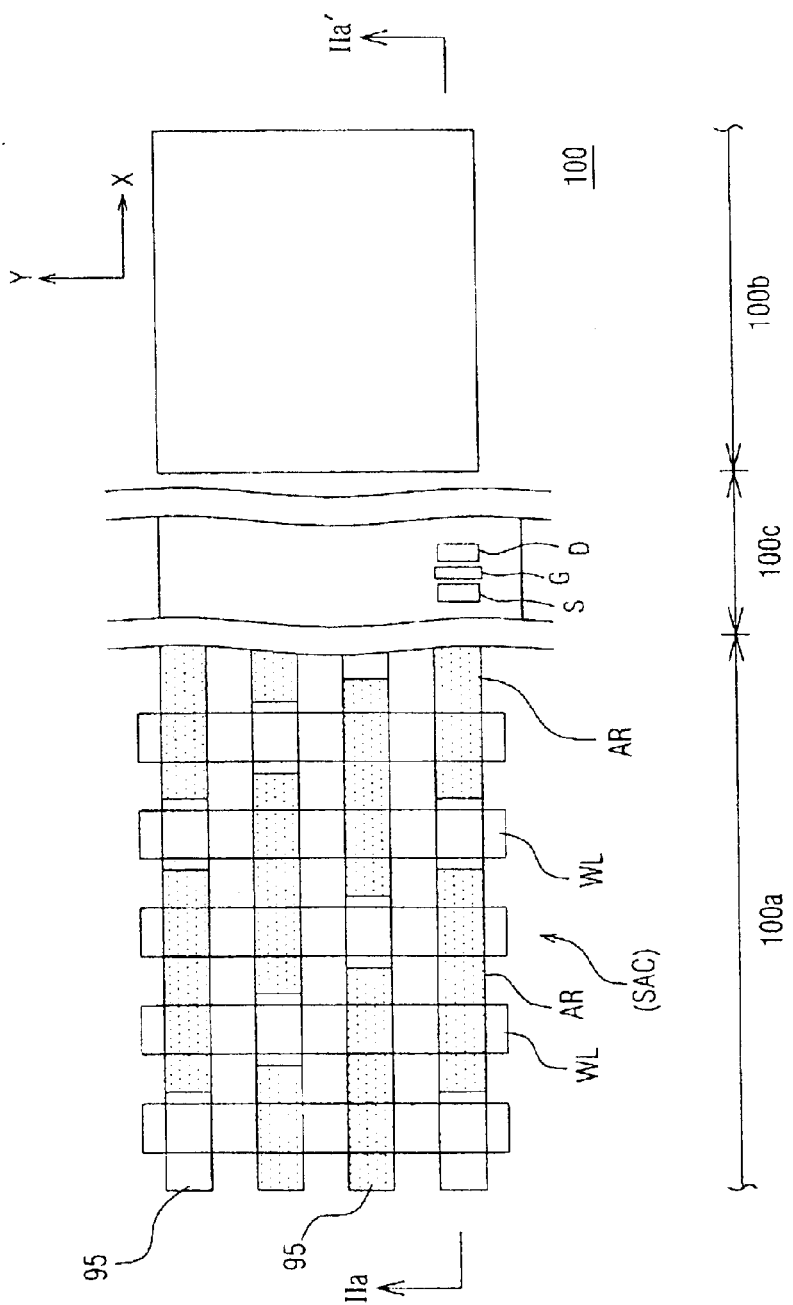
FIG. 1 is a plan view of a semiconductor device according to a first embodiment of the invention.

Semiconductor techniques according to the first embodiment of the invention will be described with reference to FIG. 1 and FIGS. 2A to 2L. Semiconductor techniques of the first embodiment form on the same substrate a system LSI having a DRAM cell part of a SAC structure and an analog capacitor part. FIG. 1 is a plan view-of the system LSI, and FIGS. 2A to 2L are cross sectional views taken along line IIa–IIa' shown in FIG. 1 and illustrating manufacture processes for the system LSI.

As shown in FIG. 1, in the flat principal surface (represented by an X-Y coordinate system) of a semiconductor substrate 100, first, second and third element regions 100a, 100b and 100c are first defined. In the first element region 100a, DRAM cells including a SAC structure are formed. In the second element region 100b, for example, analog capacitor elements occupying a large area are formed. In the third element region 100c, logical circuits including fine transistors are formed. A system LSI or a portion thereof is constituted of these different elements formed in the first to third element regions.

A DRAM cell part 100a has a number of active regions AR intermittently arranged and extending in one direction (X-axis direction shown in FIG. 1) on the semiconductor substrate 100. A plurality of word lines WL are formed extending in a direction (Y-axis direction shown in FIG. 1) crossing the X-axis direction. The word line WL traversing the active regions AR form FET gate electrodes. By etching an interlayer insulating film exposed in a mask opening 95, contact holes for forming plug electrodes can be formed in a self alignment manner relative to the word lines WL. Although not shown, a plurality of bit lines are formed at a later process, extending in a direction crossing the word lines, i.e., in the X-axis direction shown in FIG. 1. As above, contact plugs for connecting the bit lines and active regions AR in the DRAM cell part shown in FIG. 1 are formed by SAC techniques.

Manufacture processes for the system LSI will be described. First, processes of forming the structure shown in FIG. 2A will be described. A p-type silicon substrate 100 (a specific resistance is 10 ohm·cm and the principal surface is (100) plane) is prepared. A surface layer of the principal surface is thermally oxidized to form an oxide film of about 10 nm in thickness. Thereafter, a silicon nitride film having a thickness of, e.g., 112 nm is deposited by CVD. By using a resist mask, openings are formed by leaving the silicon nitride film and silicon oxide film in the element regions. After the resist mask is removed, by using the silicon nitride film and silicon oxide film as a mask, the silicon substrate 100 exposed in the openings is etched by about 300 nm.

The silicon substrate 100 is heated at 850° C. to form a thermally oxidized film of about 10 nm in thickness in the opening. Next, a silicon oxide film of 550 nm in thickness is deposited by CVD, being filled in the opening. By using the silicon nitride film as a stopper, the silicon oxide film is polished by chemical mechanical polishing (CMP). Next, the silicon nitride film is removed to form element isolation regions 101a and 101b. The element isolation regions 101a and 101b define first to third element regions 100a, 100b and 100c.

By using a resist mask, ions are selectively implanted in predetermined regions to form well regions containing active regions AR (FIG. 1) and control the threshold values of MOSFET's. Next, a phosphorous (P) doped polysilicon film of 60 nm in thickness and a capacitor dielectric film of 50 nm in thickness are deposited on the silicon substrate 100, covering the first to third element regions 100a to 100c. These films are patterned into a desired shape such as a circle and a rectangle to form a lower electrode 130 and a dielectric layer 129 for an analog capacitor.

Next, a thermally oxidized film of 5 nm in thickness is formed by thermal oxidization (750° C.). This thermally oxidized film is used as a gate insulating film 103 for MOSFET. The dielectric layer 129 for the analog capacitor element Cp is actually made of a lamination structure of a silicon nitride film and a silicon oxynitride film formed on the silicon nitride film. Next, an amorphous silicon layer of 100 nm in thickness is deposited over the silicon substrate 100 and ions are implanted into the amorphous silicon layer.

For example, P (phosphorous) ions are implanted into the NMOS region (where n-type MOSFET's are formed) and the analog capacitor region under the conditions of an acceleration energy of 10 keV and a dose of $5.0 \times 10^{15}$ cm$^{-2}$. B (boron) ions are implanted into the PMOS region (where p-type MOSFET's are formed) under the conditions of an acceleration energy of 3 keV and a dose of $5.0 \times 10^{15}$ cm$^{-2}$. With these ion implantation processes, impurities are doped in the amorphous silicon layer 105.

Thereafter, a barrier metal layer 107 and a SAC offset insulating film (silicon nitride film) 111 are stacked. The barrier metal layer 107 is made of a tungsten nitride film of 5 nm in thickness and a tungsten film of 50 nm in thickness. The offset insulating film 111 has a thickness of 200 nm. This lamination layer of the amorphous silicon layer 105, barrier metal layer 107 and offset insulating film 111 is etched by using a mask to form at the same time: lamination structural bodies G1 and G2 with MOSFET gate electrodes; and an upper electrode layer 105b, a barrier metal layer 107b and an offset insulating film 111b in the analog capacitor part. The lamination structural body G1 in the DRAM cell part 100a is made of a gate electrode layer 105a, a barrier metal layer 107a and an offset insulating film 111a. Similarly, the lamination structural body G2 in the logic circuit part 100c is made of a gate electrode layer 105c, a barrier metal layer 107c and an offset insulating film 111c. As shown in FIG. 1, the lamination structural body G1 extends along the Y-axis direction and serves also as the word line of DRAM. The lamination structural body G2 includes the gate electrode of, for example, a high speed MOSFET constituting a logic circuit. As viewed along the substrate normal, the upper electrode layer 105b is included in the lower electrode layer 130.

An analog capacitor element Cp formed in the analog capacitor part 100b is a lamination structural body made of the lower electrode layer 130, dielectric layer 129, upper electrode layer 105b, barrier metal layer 107b and offset insulating film 111b. The upper surfaces of the offset insulating films 111a and 111c of the lamination structural bodies G1 and G2, as measured from the surface of the silicon substrate 100 along its normal direction, are lower than the upper surface of the offset insulating film 111b by about 110 nm (corresponding to the total thickness of the lower electrode 130 and dielectric layer 129).

As shown in FIG. 2B, a resist mask 108 with an opening 108a is formed. As viewed along the substrate normal direction, the opening 108a includes the offset insulating film 111b of the analog capacitor element Cp and is smaller than the lower electrode layer 130. The offset insulating film 111b of the analog capacitor part Cp is etched until the height of the offset insulating film 111b becomes the same as the heights of the offset insulating films 111a and 111c of the DRAM cell part 100a and logic circuit part 100c. The offset insulating film 111b of the analog capacitor part Cp may be etched until the height of the offset insulating film 111b becomes lower than the heights of the offset insulating films 111a and 111c in the DRAM cell part 100a and logic circuit part 100c. During this etching process, a portion of the dielectric layer 129 of the analog capacitor element Cp whose surface is exposed in the opening 108a is etched and removed. The resist mask 108 is thereafter removed.

By removing the portion of the dielectric layer 129 whose surface is exposed, a metal silicide layer can be formed on the exposed upper surface of the lower electrode 130 of the analog capacitor element Cp, at the same time when a metal silicide layer is formed on source/drain regions of a transistor to be later formed in the logic circuit part 100c.

An oxide film of 2 nm in thickness for through-implantation is formed by heat treatment at 750° C. Thereafter, in the NMOS region, As (arsenic) ions for forming an extension region are implanted under the conditions of an acceleration energy of 7 keV and a dose of $2.0 \times 10^{15}$ cm$^{-2}$. Thereafter, B (boron) ions for forming a pocket implantation region are implanted under the conditions of an acceleration energy of 10 keV and a dose of $4.0 \times 10^{13}$ cm$^{-2}$.

In the PMOS region, B (boron) ions for forming an extension region are implanted under the conditions of an acceleration energy of 2 keV and a dose of $1.0 \times 10^{15}$ cm$^{-2}$. Thereafter, As (arsenic) ions for forming a pocket implantation region are implanted under the conditions of an acceleration energy of 100 keV and a dose of $4.0 \times 10^{13}$ cm$^{-2}$. A silicon nitride film of 20 nm in thickness and a silicon oxide film of 30 nm in thickness are thereafter deposited. Since a process of activating impurity ions is still not executed, in FIG. 2C, a boundary of impurity diffusion regions (extension region 121a and pocket implantation region 123a) is indicated by a broken line.

Figure 2C:
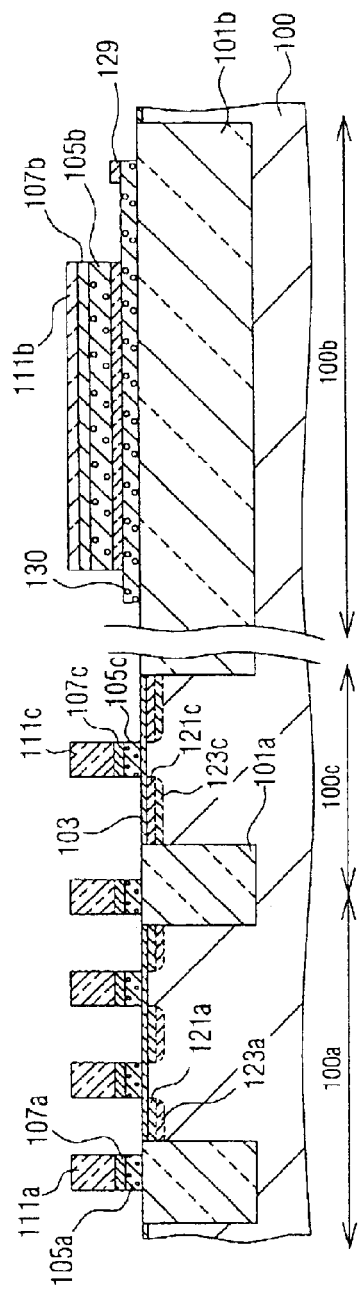
Figure 2D:
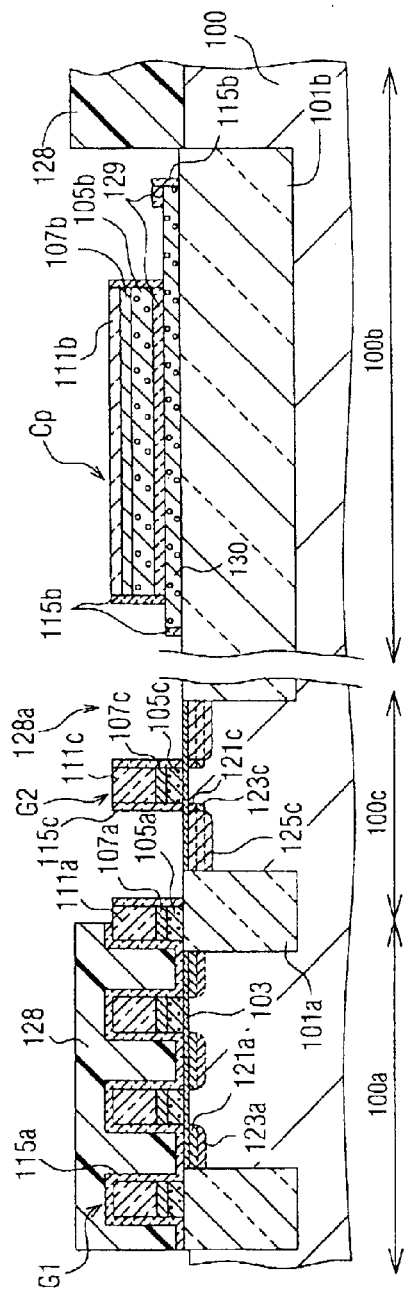

As shown in FIG. 2D, a resist mask 128 is formed which covers the DRAM cell part 100a and has an opening 128a above the analog capacitor part 100b and logic circuit part 110c, By using the resist mask 128 as an etching mask, the silicon nitride film and silicon oxide film are anisotropically etched. This anisotropic etching is performed by covering the DRAM cell part 100a with the resist mask 128 in order to prevent the surfaces of the silicon substrate 100 on both sides of the lamination structural body G1 from being silicidated in a later process. Spacer films (side wall insulating films) 115b and 115c are therefore left on the side walls of the analog capacitor element Cp and lamination structural body G3 in the analog cell part 100b and logic circuit part 100c.

Next, in the NMOS region, P ions forming source/drain regions are implanted for under the conditions of an acceleration energy of 15 keV and a dose of $5.0 \times 10^{15}$ cm$^{-2}$. In the PMOS region, B ions for forming source/drain regions are implanted under the conditions of an acceleration energy of 5 keV and a dose of $2.0 \times 10^{15}$ cm$^{-2}$. The resist mask 128 is thereafter removed.

A process of activating ions implanted in the preceding process is executed, for example, by rapid thermal annealing (RTA). In the DRAM cell part 100a, the extension region 121a and pocket implantation region 123a are therefore established, and in the logic circuit part 100c, the extension region 121c, pocket implantation region 123c and source/drain regions 125c are established. The source/drain regions 125c are formed in regions of the surface layer of the silicon substrate 100 outside of the spacer film 115c.

Next, a Co (cobalt) metal layer of 10 nm in thickness is formed over the whole substrate surface, and a heat treatment for silicidation is executed at 500° C. for 30 seconds. As shown in FIG. 2E, a CoSi$_2$ (cobalt silicide) layer 127 is therefore formed on the source/drain regions 125 in the logic circuit part 100c and on the exposed surface of the lower electrode 130 in the analog capacitor part 100b. An unreacted cobalt metal layer is removed. A heat treatment is further performed at 840° C. for 30 seconds.

As shown in FIG. 2F, a resist mask 138 is formed which has an opening 138a above the DRAM cell part 100a and covers the analog capacitor part 100b and logic circuit part 100c. The silicon nitride film and silicon oxide film in the DRAM cell part 100a are anisotropically etched. Spacer films 115a are therefore left on the side walls of the lamination structural body G1 (105a/107a/111a) formed in the DRAM cell part 100a. At this time, the gate oxide film 103 is also removed and the surface of the silicon substrate 100 is exposed. The resist mask 138 is thereafter removed.

As shown in FIG. 2G, an interlayer insulating film 132 of silicon oxide having a thickness of 500 nm is formed over the whole surface of the silicon substrate 100 by plasma CVD. This interlayer insulating film 132 is formed under the conditions that the film 132 covers the lamination structural bodies and has almost a flat upper surface.

As shown in FIG. 2H, the interlayer insulating film 132 is polished by CMP under the conditions that selectivity to the silicon nitride film is provided. For example, for such CMP conditions, slurry is used which has its pH adjusted to 10 and is made of KOH solution which contains 12 wt % of silica as abradant. For example, polishing is performed at a supply speed of slurry set to 200 cc/min., at a relative rotation speed of the substrate set to 100 rpm, and at a pressure applied to the substrate set to 300 g/cm$^2$ (29.4 Pa).

Polishing automatically stops when the upper surfaces of the offset insulating films 111a and 111c are exposed. In this case, since in the preceding process the height of the upper surface of the offset insulating film 111b was made flush with the height of the upper surface of the offset insulating film 111a of the lamination structural body G1, the upper surface of the offset insulating film 111b is also exposed at the same time. If in the preceding process the upper surface of the offset insulating film 111b was adjusted lower than the upper surface of the offset insulating film 111a of the lamination structural body G1, a portion of the interlayer insulating film 132 is left on the offset insulating film 111b.

Instead of CMP, or in addition to CMP, another etching method may be used.

As shown in FIG. 2I, a resist mask 148 is formed which covers the analog capacitor part 100b and logic circuit part 100c and has openings 95 above the DRAM cell part 100a. This opening 95 corresponds to the opening 95 of the contact plug forming mask shown in FIG. 1. The opening 95 extends in a direction crossing the extension direction of the lamination structural body G1. By using the resist mask 148, the interlayer insulating film 132 (FIG. 2G) is etched. The region from which the interlayer insulating film 132 is etched corresponds to each stripe region between the lamination structural bodies G1 for forming the SAC structure. In a partial region between the lamination structural bodies G1, a contact hole 140 is formed for contacting the impurity diffusion region (extension region). The resist mask 148 is thereafter removed.

As shown in FIG. 2J, an amorphous silicon layer 141 doped with phosphorous (P) and having a thickness of 300 nm is formed over the whole surface of the silicon substrate 100.

Thereafter, the amorphous silicon layer 141 is polished from its upper surface by CMP. This polishing is stopped at the upper surfaces of the offset insulating films 111a and 111b.

Figure 2K:
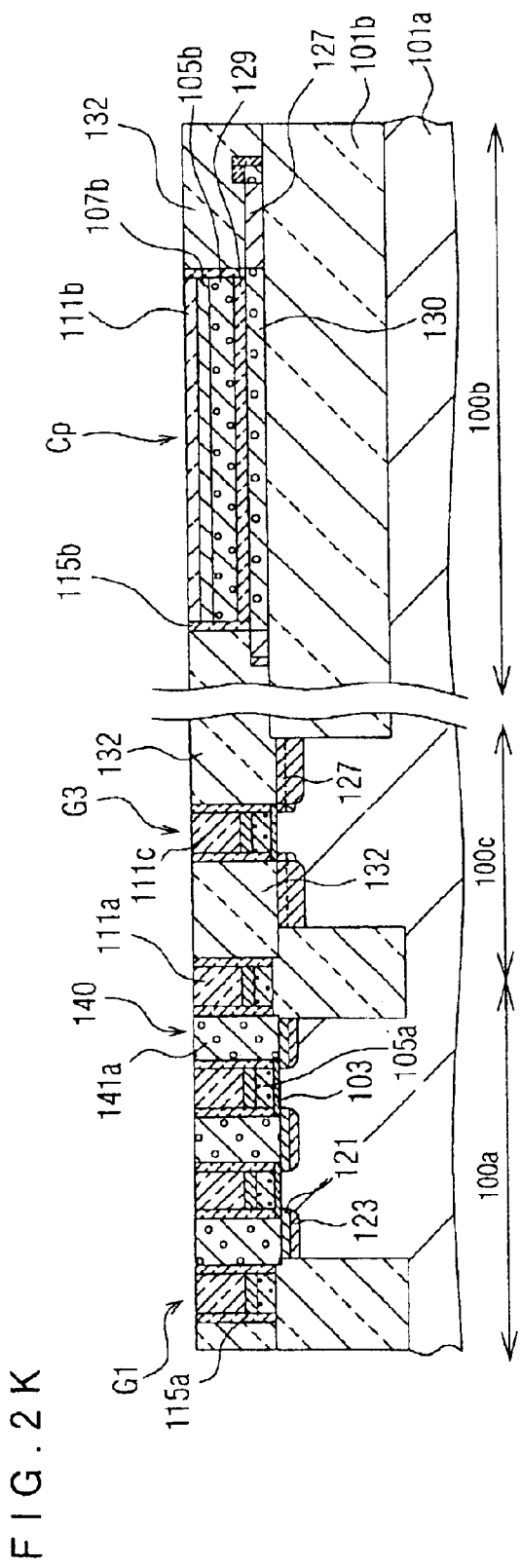

As shown in FIG. 2K, the amorphous silicon layer is left in the contact hole 140 between the lamination structural bodies G1 in the DRAM cell part 100a. A contact plug electrode 141a is therefore formed which is made of the amorphous silicon layer and separated by the lamination structural bodies G1.

Figure 2L:
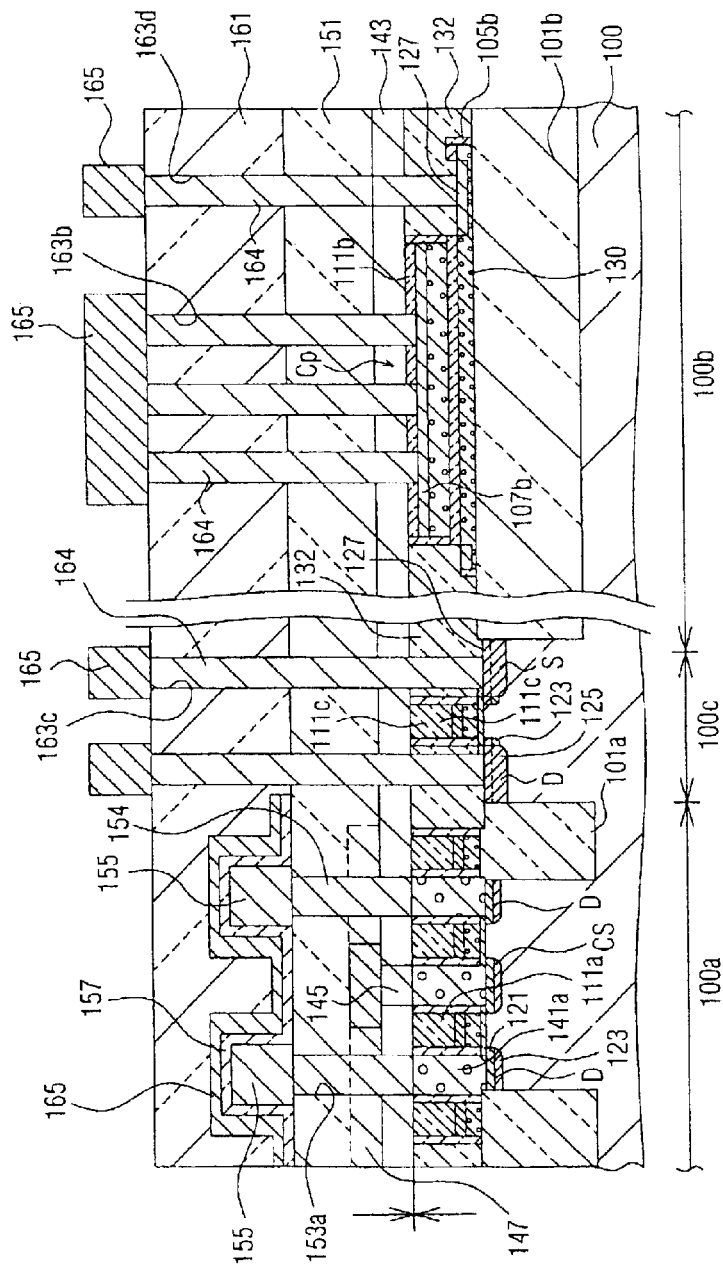

As shown in FIG. 2L, a second interlayer insulating film 143 is formed over the whole surface of the silicon substrate 100. A second contact hole 145 is formed through a partial region of the second interlayer film 143, the second contact hole 145 reaching the contact plug electrode 141a. On a partial upper surface of the second interlayer insulating film 143, a first wiring line 147 is formed which is a conductive film containing, for example, tungsten. The first wiring line 147 is connected via the second contact hole 145 to the contact plug electrode 141a formed on the extension region 121 (common source region CS) common to a pair of adjacent lamination structural bodies G1. A third interlayer insulating film 151 is formed on the second interlayer insulating film 143, covering the first wiring line 147.

A third contact hole 153a is formed through the third and second interlayer insulating films 151 and 143 to expose the upper surface of the contact plug electrode 141a formed on the extension region (drain region D). A second plug electrode 154 of doped amorphous silicon is filled in the third contact hole 153a. A DRAM capacitor lower electrode 155 made of, for example, tungsten, is formed on the upper surfaces of the second plug electrode 154 and its nearby third interlayer insulating film 151. On the DRAM capacitor lower electrode 155, a DRAM dielectric layer 157 made of, for example, silicon nitride, is formed. On the DRAM dielectric layer 157, a DRAM upper electrode layer 165 made of, for example, titanium nitride, is formed. With these processes, a DRAM capacitor is formed.

A fourth interlayer insulating film 161 is formed on the third interlayer insulating film 151, covering the DRAM capacitor. A fourth contact hole 163c is formed through the fourth to first interlayer insulating films 161 to 132. The fourth contact holes 163c expose the upper surfaces of the source/drain regions S/D (indicated at 125 in FIG. 2L) of a transistor formed in the logic circuit part or the upper surfaces of the metal silicide layers 127 formed in the surface layers of the source/drain regions.

At the same time when the contact hole 163c is formed, a fifth contact hole 163d is formed through the fourth to first interlayer insulating films 161 to 132. The fifth contact hole 163d exposes the upper surface of the lower electrode 130 (or metal silicide layer formed on the lower electrode) of the analog capacitor element Cp formed in the analog capacitor part 100b.

A six contact hole 163b is also formed at the same time through the fourth interlayer insulating film 161 and offset insulating film 111b of the analog capacitor element Cp. The six contact hole 163b exposes a partial upper surface of the barrier metal layer 107b formed on the upper electrode 105b of the analog capacitor element Cp. Plug electrodes 164 made of, for example, tungsten, are filled in the fourth to sixth contact holes 163c, 163d and 163b. Second wiring lines 165 are formed on the fifth interlayer insulating film 161, the wiring lines 165 being electrically connected to the plug electrodes 164.

With the above-described processes, the DRAM cell part 100a, analog capacitor part 100b and logic circuit 100c can be formed on the same substrate.

According to the embodiment, the higher offset insulating film is etched after the offset insulating films are deposited to make the heights of the offset insulating films uniform in the substrate plane, as shown in FIG. 2B. Therefore, as shown in FIG. 2H, the upper surfaces of the first offset insulating film 111a, interlayer insulating film 132 and second offset insulating film 111b become flush with each other. As shown in FIG. 2K, plug electrode material for the SAC structure will not be left on the interlayer insulating film. Therefore, the plug electrodes 141 are not electrically shorted even if the DRAM cell part including the SAC structure, analog capacitor part including the analog capacitor element Cp and logic circuit part including logic circuits are formed on the same substrate.

Next, semiconductor techniques according to a modification of the first embodiment of the invention will be described with reference to FIGS. 3A to 3F. In the semiconductor techniques of this modification, similar constituent elements to those of the semiconductor techniques of the first embodiment are represented by using identical reference symbols, and the detailed description thereof is omitted.

As shown in FIG. 3A, also in the semiconductor techniques of this modification, different types of elements are formed on the same substrate. In a first element region 100a, a DRAM cell part having the SAC structure is formed. In a second element region 100b, an analog capacitor part is formed. In a third element region 100c, a logic circuit part including transistors of logic circuits is formed.

FIG. 39A shows the state after several processes are performed after the state shown in FIG. 2A used for describing the semiconductor techniques of the first embodiment. In the semiconductor device manufacture processes of this modification, after the state shown in FIG. 2A, the heights of the offset insulating films are not adjusted. After the processes similar to those shown in FIGS. 2B to 2F are executed, an interlayer insulating film 132 of silicon oxide is formed over the whole surface of the silicon substrate 100. The interlayer insulating film 132 is polished from its upper surface by CMP. For example, for such CMP conditions, slurry is used which has its pH adjusted to 10 and is made of KOH solution which contains 2 wt % of silica as abradant. Under these conditions, the interlayer insulating film 132 made of silicon oxide can be selectively polished relative to the offset insulating film 111a and spacer film 115a made of silicon nitride.

As shown in FIG. 3B, polishing stops at the upper surfaces of the offset insulating film 111b and spacer film 115b made of silicon nitride. The upper surface of the offset insulating film 11b is therefore exposed. Next, polishing conditions are changed to those conditions which do not provide polishing selectivity between a silicon nitride film and a silicon oxide film. For example, if slurry of a mixture of phosphoric acid and KOH is used, the polishing speeds of silicon nitride and silicon oxide can be made equal.

As shown in FIG. 3C, the interlayer insulating film 132 is etched until the upper surfaces of the offset insulating films 111a and 111c in the DRAM cell part 100a and logic circuit part 100c are exposed. In this case, the second offset insulating film 111b and spacer films 115b can be etched at the same time. Some over-etch does not pose any practical problem.

As shown in FIG. 3D, a resist mask 168 is formed which covers the analog capacitor part 100b and logic circuit part 100c and has an opening 168a above a partial area of the first element region 100a. The interlayer insulating film 132 formed in a partial area between lamination structural bodies G1 is selectively removed. The surfaces of the silicon substrate 100 (common source region CS and drain region D) between lamination structural bodies G1 are therefore exposed. The resist mask 168 is thereafter removed. In this manner, contact holes 140 reaching the silicon substrate 100 are formed in the partial areas from which the interlayer insulating film 132 was removed.

As shown in FIG. 3E, an impurity doped amorphous silicon film 141 is formed over the silicon substrate 100 to a thickness of 300 nm, covering the lamination structural bodies G1 and G3 and a lamination structural body G2 (analog capacitor element Cp). The doped amorphous silicon layer 141 is polished by CMP by using as a stopper the offset insulating films 111a and 111c formed in the DRAM cell part 100a and logic circuit part 100c. The doped amorphous silicon layer 141 is removed down to a height of the upper surfaces of the offset insulating films 111a and 111c. As shown in FIG. 3F, it is therefore possible to leave the impurity doped amorphous silicon layer 141 only in the contact holes 140. The amorphous silicon layer 141 extending in one direction can be separated by a pair of adjacent lamination structural bodies G1 (word lines).

Similar to the semiconductor device of the first embodiment, a silicide layer 127 may be formed on an exposed upper surface of the lower electrode 130 of the analog capacitor element Cp. This silicide layer lowers the sheet resistance of the lower electrode 130 and also the contact resistance to a plug electrode to be later formed.

The structure shown in FIG. 3F is similar to that shown in FIG. 2K used for describing the semiconductor techniques of the first embodiment. Thereafter, semiconductor device manufacture processes similar to the first embodiment are performed to complete a semiconductor device.

With the above processes, it is possible to form the DRAM cell part having the SAC structure in the first element region 100a, the analog capacitor part including the analog capacitor element Cp in the second element region 100b, and the logic circuit part including transistors constituting loci circuits in the third element region 100c, respectively on the same substrate.

According to this modification, the higher offset insulating film is etched to make the heights of the offset insulating films uniform in the substrate plane. Therefore, the upper surfaces of the first offset insulating film 111a, interlayer insulating film 132 and second offset insulating film 111b become flush with each other. Plug electrode material for the SAC structure will not be left on the interlayer insulating film. Therefore, the plug electrodes 141 are not electrically shorted even if the DRAM cell part including the SAC structure, analog capacitor part including the analog capacitor element Cp and logic circuit part including logic circuits are formed on the same substrate.

Semiconductor techniques according to a second embodiment of the invention will be described with reference to FIG. 4 and FIGS. 5A to 5I.

Figure 4:
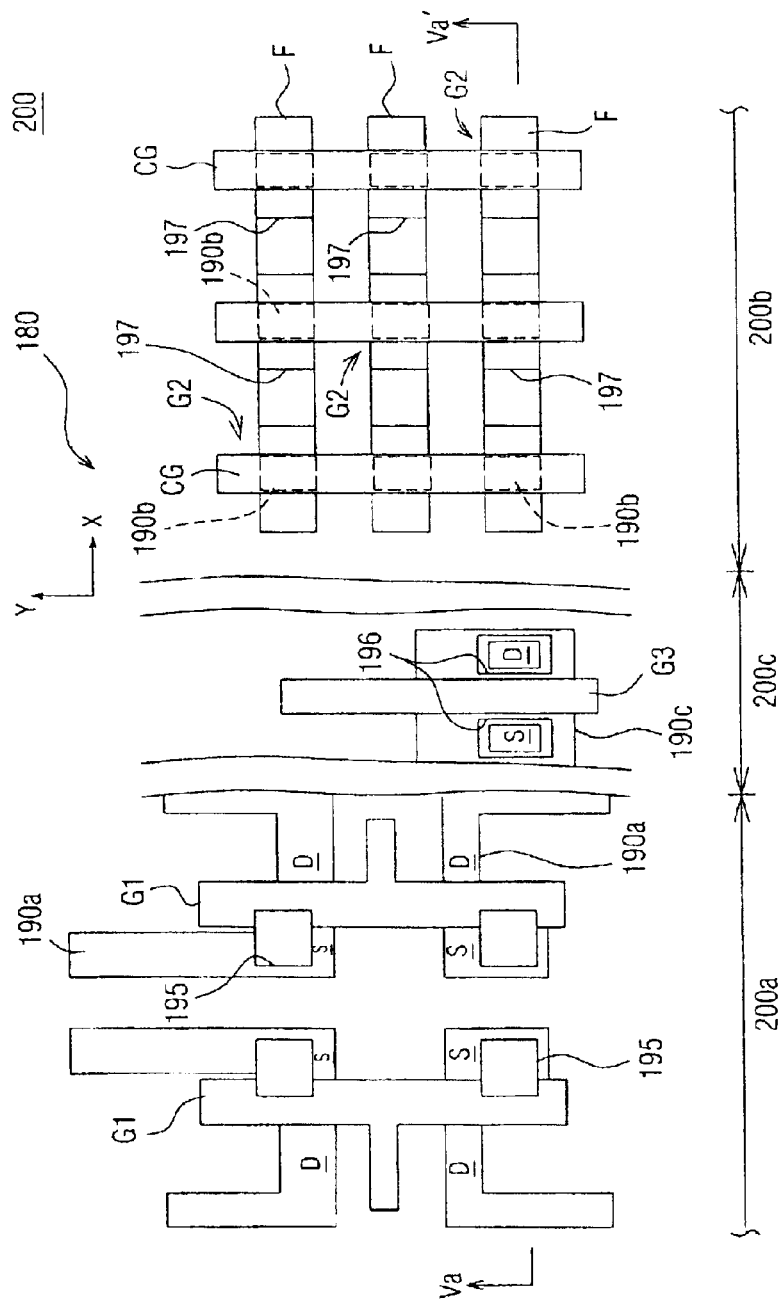
FIG. 4 is a plan view of the semiconductor device according to a second embodiment of the invention.

The semiconductor techniques of this embodiment concerns about a semiconductor integrated circuit (flash microcomputer) mixed with a static random access memory (SRAM) cell part including SRAM's, a logic circuit part and a flash memory part. FIG. 4 is a plan view of a flash microcomputer, FIGS. 5A to 5I are cross sectional views taken along line XIIa–XIIa' shown in FIG. 4 and illustrating manufacture processes for the flash microcomputer.

As shown in FIG. 4, the flash microcomputer has a first element region (SRAM cell part) 200a, a second element region (flash memory cell part) 200b and a third element region (logic circuit part) 200c, respectively defined in the two-dimensional flat surface of a silicon substrate 200. In the SRAM cell part 200a, SRAM's are mainly formed. In the flash memory part 200b, flash memories are mainly formed. In the logic circuit part 200c, logic circuits are mainly formed.

In the SRAM cell part 200a, active regions 190a, lamination structural bodies G1 including gate electrodes traversing the active regions, and source/drain regions S/D formed on both sides of the lamination structural bodies G1 are formed. In FIG. 4, one cell has a pair of lamination structural bodies G1 and source/drain regions S/D formed on both sides of each lamination structural body G1 to form four MOSFET transistors.

The flash memory cell part 200b has a number of impurity diffusion regions F extending in one direction (X-direction shown in FIG. 4) in a stripe shape and a number of island storage gates 190b arranged in a matrix shape in the impurity diffusion regions F. In the flash memory cell part 200b, control gate electrodes CG are also formed passing over the storage gates 190b and extending in a direction crossing the impurity diffusion regions F. In the logic circuit part 200c, a lamination structural body G3 including the gate electrode of a transistor is formed in the active region 190c, and source/drain regions S/D are formed on both sides of the lamination structural body G3.

A mask for forming contact holes for plug electrodes is formed above the first active region 190a (formed in the first element region 200a), storage gates 190b and source/drain regions S/D (formed in the second and third element regions 200b and 200c). The mask has openings 195, 197 and 196 for forming contact holes in the first to third element regions. The contact hole has a rectangular shape.

The opening of a mask pattern for forming contact holes in the DRAM cell part shown in FIG. 1 has a line shape continuously extending in one direction. In contrast, the opening of the mask pattern for forming contact holes in the SRAM cell part and flash memory cell part shown in FIG. 4 has a rectangular shape not the line shape. These openings are arranged intermittently in the X- and Y-directions.

Manufacture processes for this semiconductor device will be described in the following. A silicon substrate 200 having a p-type conductivity (substrate specific resistance of about 10 ohm·cm, principal surface of (100) plane) is prepared. The surface of the silicon substrate 200 is thermally oxidized about 10 nm in thickness. Thereafter, a silicon nitride film of 112 nm in thickness is deposited by CVD. By using a resist mask, the silicon nitride film and silicon oxide film in the area where element isolation regions are formed are removed. After the resist mask is removed, by using the silicon nitride film and silicon oxide film in the element regions as a mask, the surface of the silicon substrate 200 is etched about 300 nm in depth in the region where the element separation regions are formed. A thermally oxidized film (850° C., 10 nm in thickness) is formed on the surface of the region where the element isolation region is to be formed. After a silicon oxide film of 50 nm in thickness is deposited by CVD, the silicon oxide film is polished by CMP by using the silicon nitride film as a stopper.

Next, the silicon nitride film is removed to form element isolation regions 201a, 201b and 201c. These element isolation regions 201a, 201b and 201c define first to third element regions 200a, 200b and 200c. By using a resist mask, ions are implanted into predetermined regions of the silicon substrate 200. This ion implantation process forms well regions including the active region and controls the threshold value of MOSFET.

The surface of the silicon substrate is thermally oxidized at 900° C. to form a tunneling oxide film 225 of 10 nm in thickness. On this tunnelling oxide film 225, a phosphorous (P) doped amorphous silicon film 227 of 90 nm·in thickness is deposited. Next, on the amorphous silicon film 227, an ONO film 223 is formed. The ONO film 223 has a lamination structure of a silicon oxide film of 9 nm in thickness formed by CVD, a silicon nitride film of 9 nm in thickness formed by CVD, and a silicon oxide film of 3 nm in thickness thermally oxidized at 950° C.

Next, a stripe mask pattern extending in the X-direction in FIG. 4 is formed above the second element region (flash memory cell part) 200b. By using this mask pattern, the tunneling oxide film 225, amorphous silicon film 227 and ONO film 223 are selectively etched and removed to leave a stripe storage gate pattern extending in the X-direction in the flash memory cell part 200b.

Next, a gate insulating film 203 of 2 nm in thickness is formed by thermal oxidation at 750° C. in the SRAM cell part 200a and logic circuit part 200c of the silicon substrate 200. In this case, since the ONO film 223 is formed on the storage gate pattern in the flash memory cell part 200b, the storage gate pattern is not oxidized and its thickness hardly changes. An amorphous silicon film 205 (205a, 205b, 205c) of 100 nm in thickness is deposited over the whole surface of the silicon substrate 200. In the NMOS region, P (phosphorous) ions are implanted under the conditions of an acceleration energy of 10 keV and a dose of $5.0 \times 10^{15}$ cm$^{-2}$. In the PMOS region, B (boron) ions are implanted under the conditions of an acceleration energy of 3 keV and a dose of $5.0 \times 10^{15}$ cm$^{-2}$. In this manner, the amorphous silicon film 205 is given a conductivity.

On the whole surface of the silicon substrate 200, a barrier metal layer 207 (207a, 207b, 207c) and a SAC offset insulating film (silicon nitride film) 211 (211a, 211b, 211c) are laminated. The barrier metal layer 207 is made of a tungsten nitride film of 5 nm in thickness and a tungsten film of 50 nm in thickness. The SAC offset insulating film 211 has a thickness of 200 nm. These lamination structures are patterned into lamination structural bodies having the same shape as viewed in plan. As shown in FIG. 5A, in the SRAM cell part 200a, a lamination structural body G1 (gate electrode layer 205a/barrier metal layer 207a/offset insulating film 211a) is formed. In the logic circuit part 200c, a lamination structural body G3 (gate electrode layer 205c/barrier metal layer 207c/offset insulating film 211c) including the gate electrode of a transistor constituting a logic circuit is formed. On the tunnelling oxide film 225 in the flash memory cell part 200b, a lamination structural body G2 (amorphous silicon film 227/ONO film 223/gate electrode layer 205b/barrier metal layer 207b/offset insulating film 211b) is formed. With this patterning process, the stripe storage electrode structure formed by the preceding process is changed to island storage electrode structures. The control gate CG (including gate electrode layer 205b/barrier metal layer 207b/offset insulating film 211) extends in the Y-direction in FIG. 4.

In the state shown in FIG. 5B, the height of the upper surface of the offset insulating film 211b is higher than the upper surfaces of the offset insulating films 211a and 211c by about 105 nm.

A resist mask 208 is formed which has an opening 208a only above the flash memory cell part 200b and covers the SRAM cell part 200a and logic circuit part 200c. The offset insulating film 211b is etched until the height of the upper surface of the offset insulating film 211b becomes nearly equal to the heights of the upper surfaces of the offset insulating films 211a and 211c. This etching may continue until the height of the upper surface of the offset insulating film 211b becomes lower than the heights of the upper surfaces of the offset insulating films 211a and 211c.

Processes of forming the structure shown in FIG. 5C will be described. An oxide film of 2 nm in thickness for through-implantation is formed on the silicon substrate 200 by heat treatment at 750° C. Thereafter, in the NMOS region, As (arsenic) ions for forming an extension region are implanted under the conditions of an acceleration energy of 7 keV and a dose of $2.0 \times 10^{15}$ cm$^{-2}$. Thereafter, B (boron) ions for forming a pocket implantation region are implanted under the conditions of an acceleration energy of 10 keV and a dose of $4.0 \times 10^{13}$ cm$^{-2}$.

In the PMOS region, BF$_2$ ions for forming an extension region are implanted under the conditions of an acceleration energy of 2 keV and a dose of $1.0 \times 10^{15}$ cm$^{-2}$. Thereafter, As (arsenic) ions for forming a pocket implantation region are implanted under the conditions of an acceleration energy of 100 keV and a dose of $4.0 \times 10^{13}$ cm$^{-2}$.

A silicon nitride film of 20 nm in thickness and a silicon oxide film of 30 nm in thickness are thereafter deposited and an anisotropic etching process is executed to leave space films (side wall insulating films) 215a and 215c on the side walls of the lamination structural bodies G1 and G3. In this case, the anisotropic etching process is performed by covering the flash memory cell part 200b with a resist mask in order to prevent the extension region in the flash memory cell part 200b from being silicidated at the later process.

Next, in the NMOS region, P ions for forming source/drain regions are implanted under the conditions of an acceleration energy of 15 keV and a dose of $5.0 \times 10^{15}$ cm$^{-2}$. In the PMOS region, B ions are implanted under the conditions of an acceleration energy of 5 keV and a dose of $2.0 \times 10^{15}$ cm$^{-2}$. Annealing, for example, RTA, is performed for 3 seconds at 1025° C. to establish extension regions 221a, 221b and 221c, pocket implantation regions 223a, 223b and 223c and source/drain regions 225a and 225c.

Next, a cobalt metal layer of 10 nm in thickness is formed on the silicon substrate 200, for example, by sputtering. Then, an annealing process is performed for 30 seconds at 500° C. to silicidate the surface layers of the source/drain regions 225a formed in the SRAM cell part 200a and the surface layers of the source/drain regions 225c formed in the logic circuit part 200c. An unreacted cobalt metal layer on the silicon oxide film is selectively removed, and thereafter annealing is performed for 30 seconds at 840° C. With these processes, cobalt silicide layers 228a and 228c are formed on the source/drain regions 225a and 225c.

Similar to the semiconductor device manufacture processes of the first embodiment, a resist mask is formed which covers the SRAM cell part 200a and logic circuit part 200c and has an opening above the flash memory cell part 200b. By using this resist mask, the silicon nitride film and silicon oxide film formed in the flash memory cell part 200b are anisotropically etched and removed to leave spacer films 215b on the side walls of the lamination structural body G2.

As shown in FIG. 5D, an interlayer insulating film (silicon oxide film) 232 is deposited to a thickness of 500 nm on the whole surface of the silicon substrate 200 by plasma CVD. This interlayer insulating film 232 is formed under the conditions that it covers the lamination structural bodies G1 to G3 and the surface of the film 232 becomes flat. The interlayer insulating film 232 is polished from its upper surface by CMP under the conditions that provide a selectivity relative to the silicon nitride film. When the upper surfaces of the offset insulating films 211a, 211b and 211c are exposed, the upper surfaces of the spacer layers 215a, 215b and 215c are also exposed. At this time, the polishing process automatically stops. Since the upper surface of the offset insulating film 211b in the flash memory cell part 200b was adjusted at the preceding process to have the same height as those of the upper surfaces of the offset insulating films 211a and 211c, the upper surfaces of the offset insulating films 211a, 211b and 211c are exposed nearly at the same time. If the upper surface of the offset insulating film 211b was etched lower than the upper surfaces of the offset insulating films 211a and 211c, a portion of the interlayer insulating film 232 is left on the offset insulating film 211b. However, no practical problem occurs at the later processes.

As shown in FIG. 4 and FIG. 5F, a resist mask 230 is formed which has openings 195, 197 and 195c in the areas where contact holes for contact plugs are to be formed. By using this resist mask 230, the interlayer insulating films 232a, 232b and 232c formed in spaces between adjacent lamination structural bodies G1, G2 and G3 are removed. Contact holes 235a, 235b and 235c are therefore formed which expose the upper surfaces of the cobalt silicide layers 228a and 228c and the upper surface of the extension region 221b. The contact hole 235a is formed near at the lamination structural body G1, and in some area it is formed in a self alignment with the spacer films 215a formed on the side walls of the lamination structural body G1. The contact hole 235b is formed near at the lamination structural body G2, and the position of the contact hole 235b is aligned by a usual mask process. The contact hole 235c is formed near at the lamination structural body G3, and in some area it is formed in a self alignment with the spacer films 215c formed on the side walls of the lamination structural body G3 to realize the SAC structure.

As shown in FIG. 5F, although interlayer insulating films 232c are left on the spacer films 215c in the contact hole 235c, these left films do not pose any problem at the later processes.

Figure 5G:
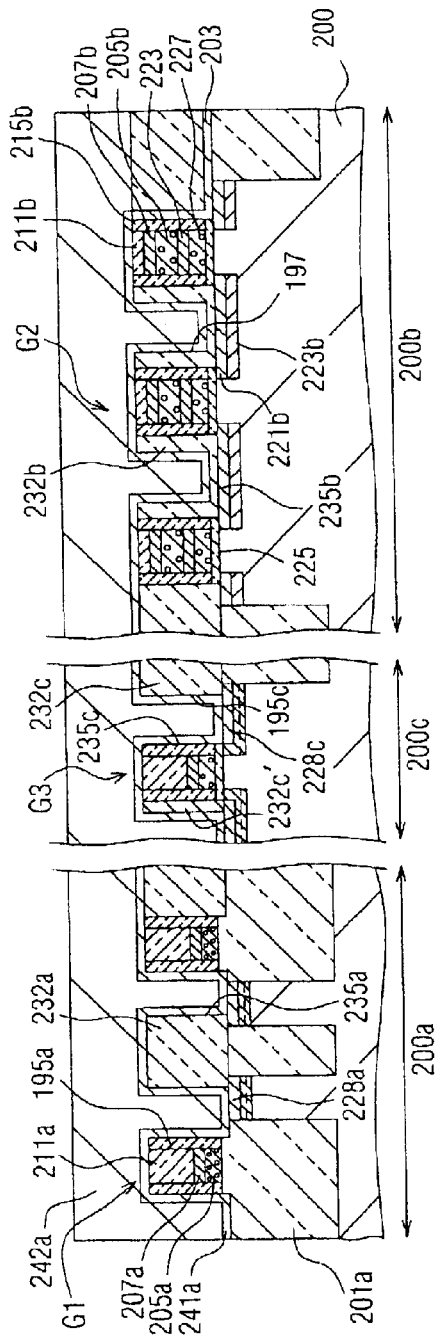

As shown in FIG. 5G, a barrier metal layer 241a (10 nm thick Ti layer/20 nm thick TiN layer) and a tungsten layer 242a (200 nm thick) are deposited in the contact holes 235a, 235b and 235c. The barrier metal layer 241a and tungsten layer 242a are buried in the contact holes and also formed on the interlayer insulating films 232a, 232b and 232c. The upper surface of the tungsten layer 242a becomes approximately flat.

Figure 5H:
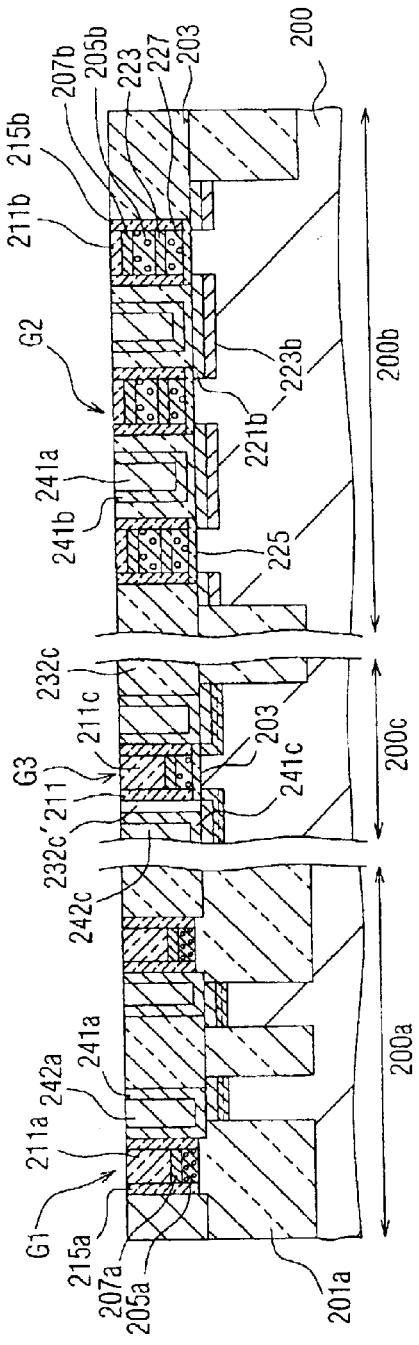
Figure 51:
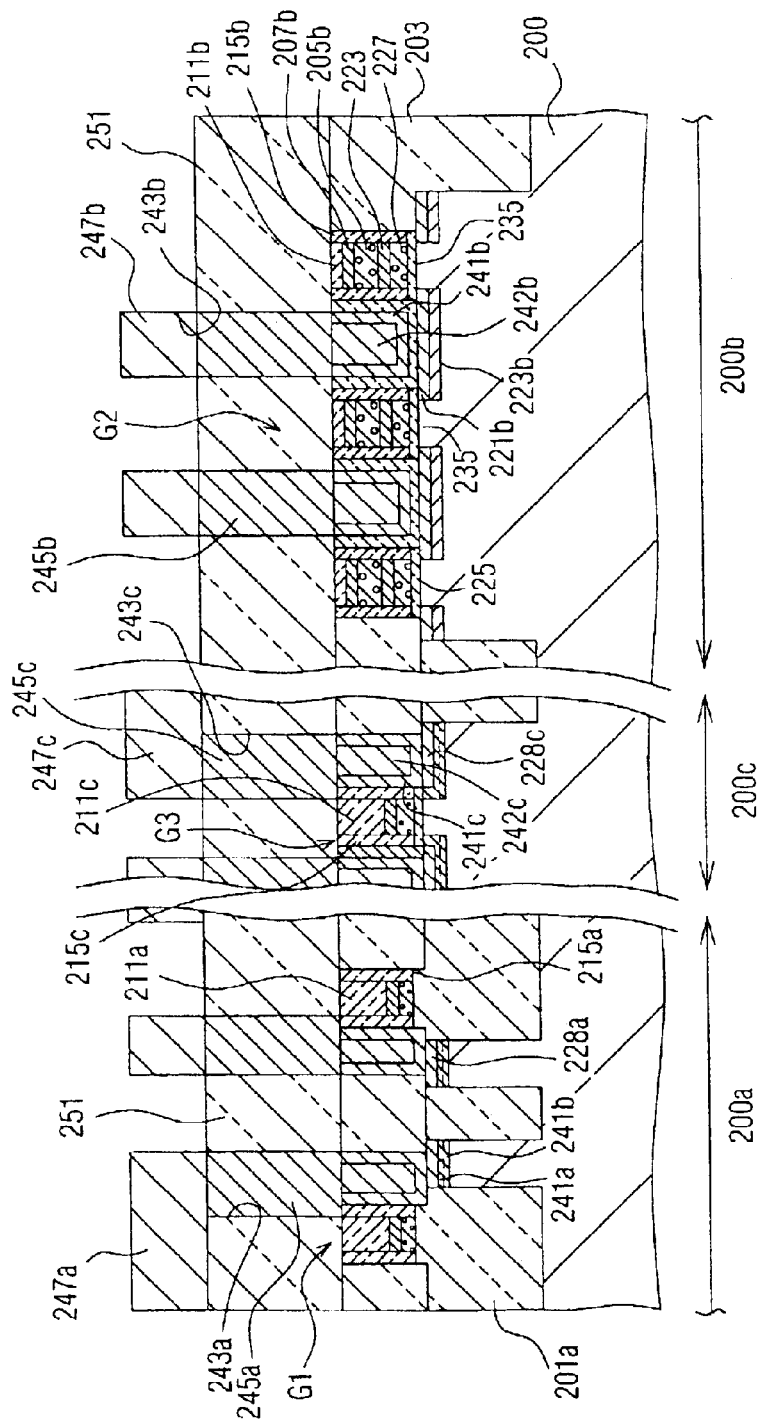

As shown in FIG. 5H, by using the offset insulating films 211a, 211b and 211c as a stopper, the barrier metal layer 241a and tungsten layer 242a are polished by CMP. This CMP polishes the barrier metal layer 241a and tungsten layer 242a to the upper surfaces of the lamination structural bodies G1, G2 and G3 and leaves them only in the contact holes 235a, 235b and 235c. Plug electrodes 241a/242a are therefore electrically separated by the lamination structural bodies G1, G2 and G3.

As shown in FIG. 5I, similar to the process described with the first embodiment, another interlayer insulating film 251 is formed on the interlayer insulating film 232, covering the lamination structural bodies G1, G2 and G3. Second contact holes 243a, 243b and 243c are formed through the interlayer insulating film 251 (or through the interlayer insulating films 251 and 232). Plug electrodes 245a, 245b and 245c are formed in the second contact holes, and wiring layers 247a, 247b and 247c are formed on the interlayer insulating film 251. The wiring layers 247a, 247b and 247c are connected to the cobalt silicide layers 228a and 228c or impurity diffusion regions 221b.

According to the semiconductor techniques of this embodiment, the higher offset insulating film is etched after the offset insulating films are deposited to make the heights of the offset insulating films uniform in the substrate plane. Therefore, the plug electrode material for the SAC structure is not left on the interlayer insulating film even if the SRAM cell part, the flash memory cell part including the SAC structure and the logic circuit part including logical circuits are formed on the same substrate. The plug electrodes are not electrically shorted.

Next, semiconductor techniques according to a modification of the second embodiment of the invention will be described with reference to FIGS. 6A to 6F. Similar to the semiconductor techniques of the second embodiment, the semiconductor techniques of this modification concerns about the semiconductor integrated circuit techniques of forming an SRAM cell part, a logic circuit part and a flash memory cell part on the same substrate. In the semiconductor techniques of this modification, similar constituent elements to those of the semiconductor techniques of the second embodiment are represented by using reference numbers added with 100 to those of the second embodiment, and the detailed description thereof is omitted.

FIGS. 6A to 6F are cross sectional views illustrating manufacture processes according to this modification. Similar to the semiconductor techniques of the second embodiment, in a first element region 300a, an SRAM cell part is formed, in a second element region 300b, a flash memory cell part is formed, and in a third element region 300c, a logic circuit part is formed.

First, a silicon substrate 300 having a p-type conductivity (substrate specific resistance of about 10 ohm·cm, principal surface of (100) plane) is prepared. The surface of the silicon substrate 300 is thermally oxidized about 100 nm in thickness. Thereafter, a silicon nitride film of 112 nm in thickness is deposited on the silicon substrate 300 by CVD. By using a resist mask, the silicon nitride film and silicon oxide film in the area where element isolation regions are to be formed are removed. After the resist mask is removed, by using the silicon nitride film and silicon oxide film in the element regions as a mask, the surface of the silicon substrate 300 is etched about 300 nm in depth in the region where the element separation regions are to be formed. The substrate 300 is thermally oxidized at 850° C. to form a thermally oxidized film of 10 nm in thickness. Next, a silicon oxide film is formed to a thickness of 550 nm by CVD. Next, by using the silicon nitride film as an etching stopper, the silicon oxide film is polished by CMP.

Next, the silicon nitride film is removed to form element isolation regions 301 (301a, 301b and 301c).

By using a resist mask, ions are implanted into predetermined regions of the silicon substrate 300. This ion implantation process forms well regions and controls the threshold value of MOSFET. A tunneling oxide film 325 is formed to a thickness of 10 nm at 900° C. in the third element region 300c including the flash memory cell part. Next, after a P doped amorphous silicon film 327 of 90 nm in thickness is deposited, an ONO film 328 is formed. The ONO film 328 has a lamination structure of a silicon oxide film of 6 nm in thickness formed by CVD, a silicon nitride film of 9 nm in thickness formed by CVD, and a silicon oxide film of 3 nm in thickness thermally oxidized at 950° C. Next, a stripe mask pattern extending in the X-direction in FIG. 4 is formed above the flash memory cell part 300b. A plurality of stripes of the resist mask are disposed in parallel. By using this mask pattern, the tunneling oxide film 325, amorphous silicon film 327 and ONO film 328 formed in the SRAM cell part 300a and logic circuit part 300c are selectively etched and removed to leave parallel stripe storage gates extending in the X-direction in the flash memory cell part 300b as shown in FIG. 4. FIG. 6A is a cross sectional view showing a left lamination structure of the tunneling oxide film 325, amorphous silicon layer 327, ONO film 328, amorphous silicon layer 305, barrier metal layer 307, and insulating film 311. This lamination structure between the stripe patterns was etched and removed.

After the resist mask is removed, a gate insulating film 303 of 2 nm in thickness is formed by thermal oxidation at 750° C. in the SRAM cell part 300a and logic circuit part 300c. In this case, the surface of the ONO film 328 is hardly oxidized. An amorphous silicon film 305 of 100 nm in thickness is deposited on the silicon substrate 300. In the NMOS region, P ions are implanted under the conditions of an acceleration energy of 10 keV and a dose of $5.0 \times 10^{15}$ cm$^{-2}$. In the PMOS region, B ions are implanted under the conditions of an acceleration energy of 3 keV and a dose of $5.0 \times 10^{15}$ cm$^{-2}$. Next, on the whole surface of the silicon substrate 300, a barrier metal layer 307 is formed. The barrier metal layer 307 is made of a tungsten nitride film of 5 nm in thickness and a tungsten film of 50 nm in thickness formed on the tungsten nitride film. On the barrier metal layer 307, an insulating film 311 is formed which is made of silicon nitride and becomes an offset insulating film at a later process.

As shown in FIG. 6A, the upper surface of the insulating film 311 in the flash memory cell part 300b is higher than the upper surfaces of the insulating films 311 in the SRAM cell part 300a and logic circuit part 300c by about 105 nm.

As shown in FIG. 6B, a resist mask 328 is formed which has an opening 328a above the flash memory cell part 300b and covers the SRAM cell part 300a and logic circuit part 300c. The insulating film 311 in the flash memory cell part 300b is etched until the height of the upper surface of the insulating film 311 becomes nearly equal to the heights of the upper surfaces of the insulating films 311 in the SRAM cell part 300a and logic circuit part 300c. This etching may continue until the height of the upper surface of the insulating film 311 in the flash memory part 300b becomes lower than the heights of the upper surfaces of the insulating films 311 in the SRAM cell part 300a and logic circuit part 300c.

Figure 6C:
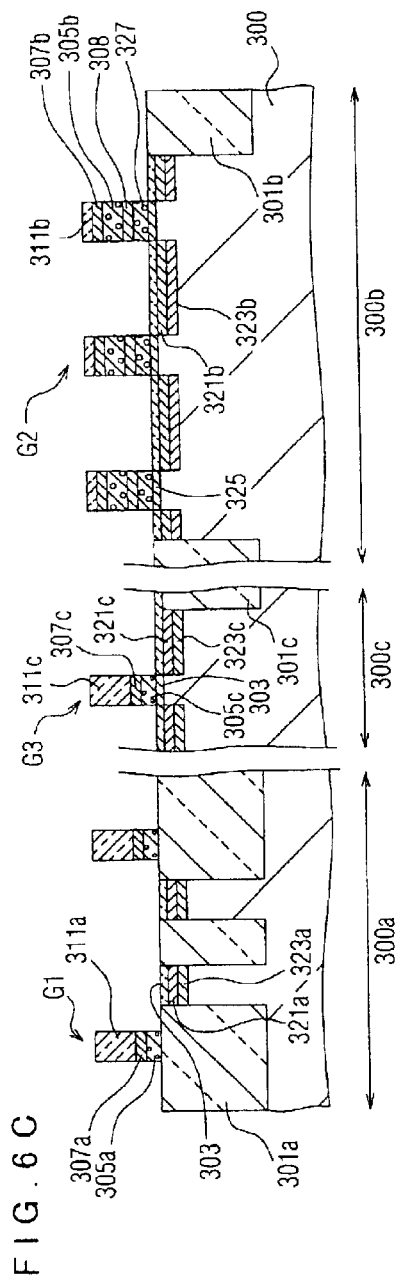

The insulating film 311 and underlying films are patterned. As shown in FIG. 6C, in the SRAM cell part 300a, a lamination structural body G1 is formed which is made of an offset insulating film 311a, a barrier metal layer 307a and an amorphous silicon layer 305a. In the flash memory cell part 300b, a lamination structural body G2 is formed which is made of an offset insulating film 311b, a barrier metal layer 307b and an amorphous silicon layer 305b. In the logic circuit part 300c, a lamination structural body G3 is formed which is made of an offset insulating film 311c, a barrier metal layer 307c and an amorphous silicon layer 305c.

It is therefore possible to form at the same time the lamination structural bodies G1 and G3 in the SRAM cell part 300a and logic circuit part 300c and the lamination structural body G2 in the flash memory cell part 300b. As shown in FIG. 4, in the flash memory cell part 300a, stripe control gates CG extending in the Y-direction are therefore formed.

Figure 6D:
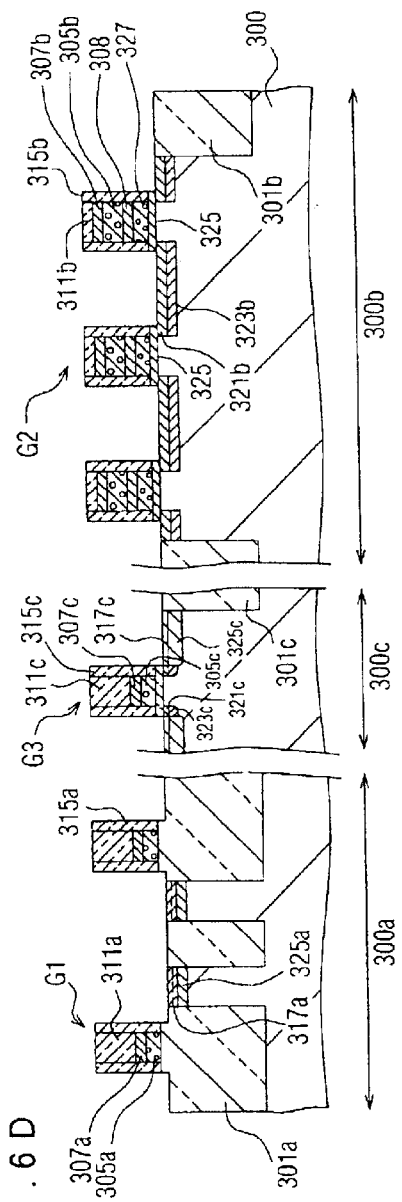
Figure 7:
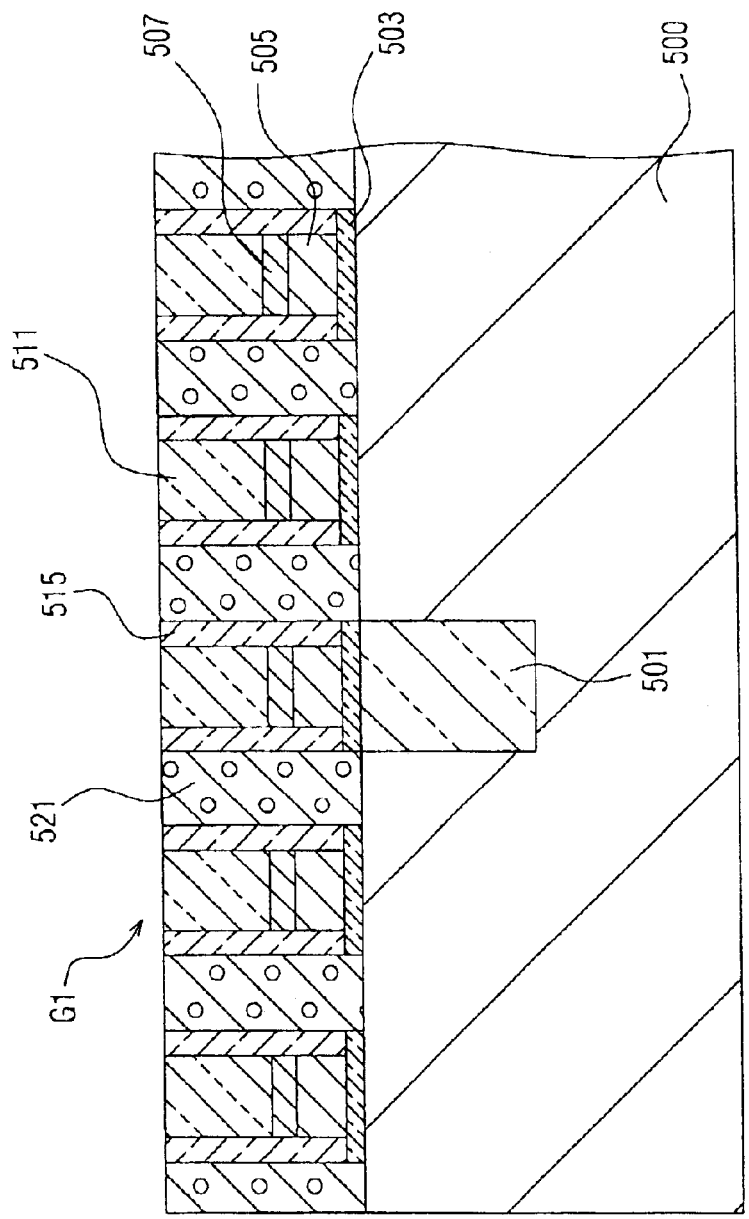
FIG. 7 is a cross sectional view showing a conventional SAC structure.
Figure 8A:
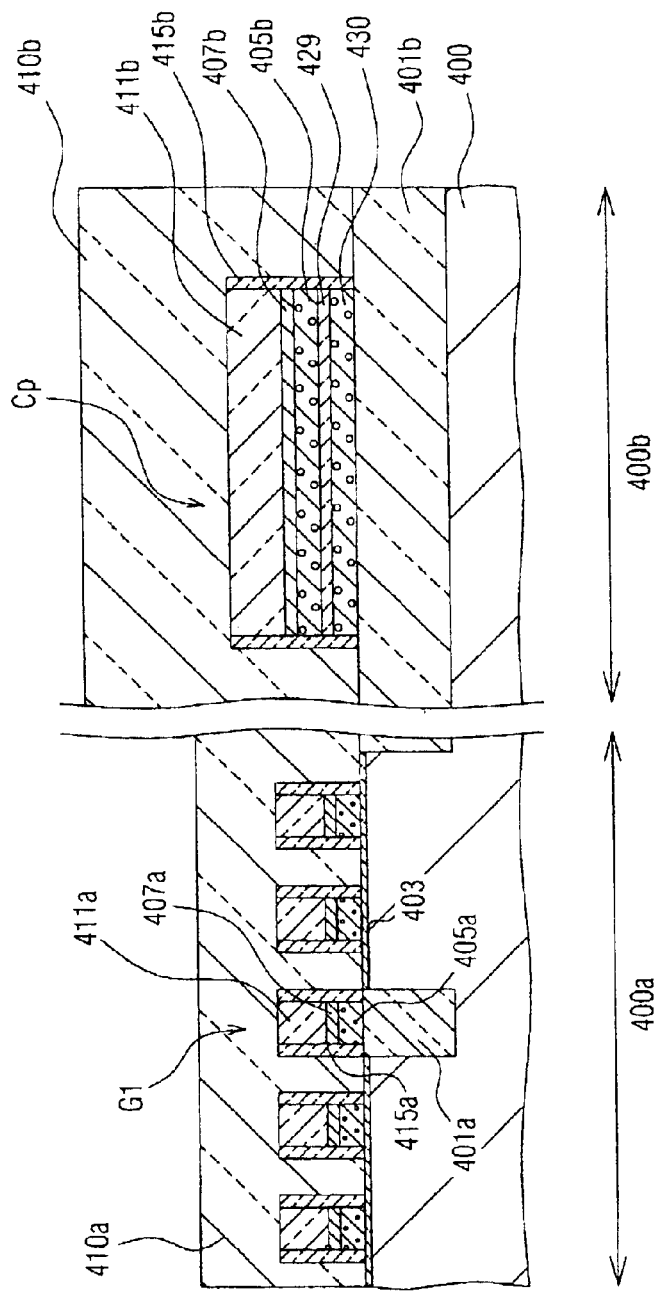
FIGS. 8A to 8E are cross sectional views illustrating manufacture processes of forming DRAM cells and analog capacitors on the same substrate.
Figure 8B:
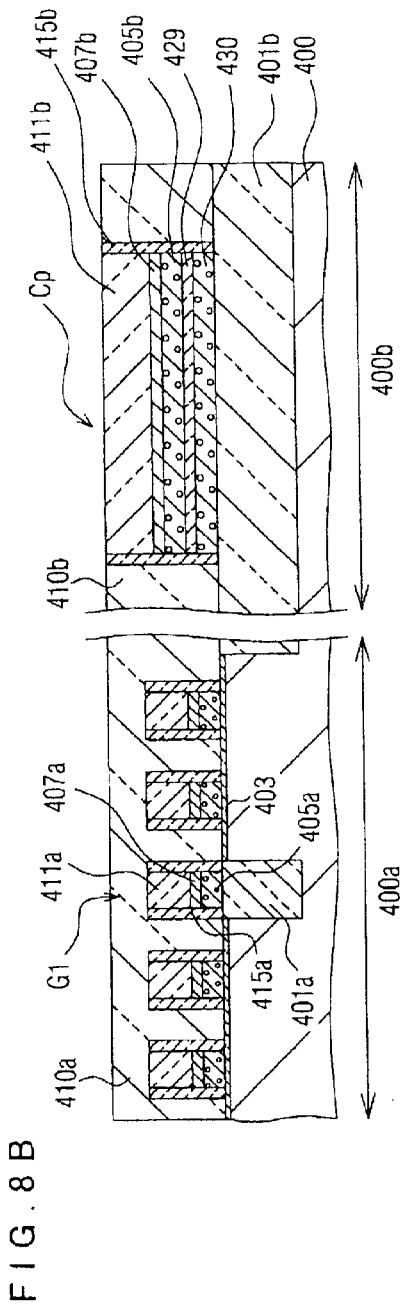
Figure 8C:
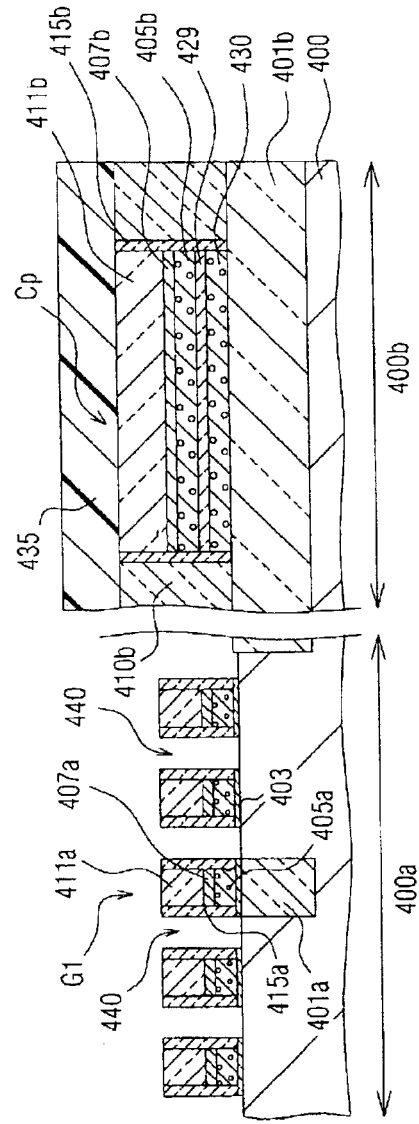
Figure 8D:
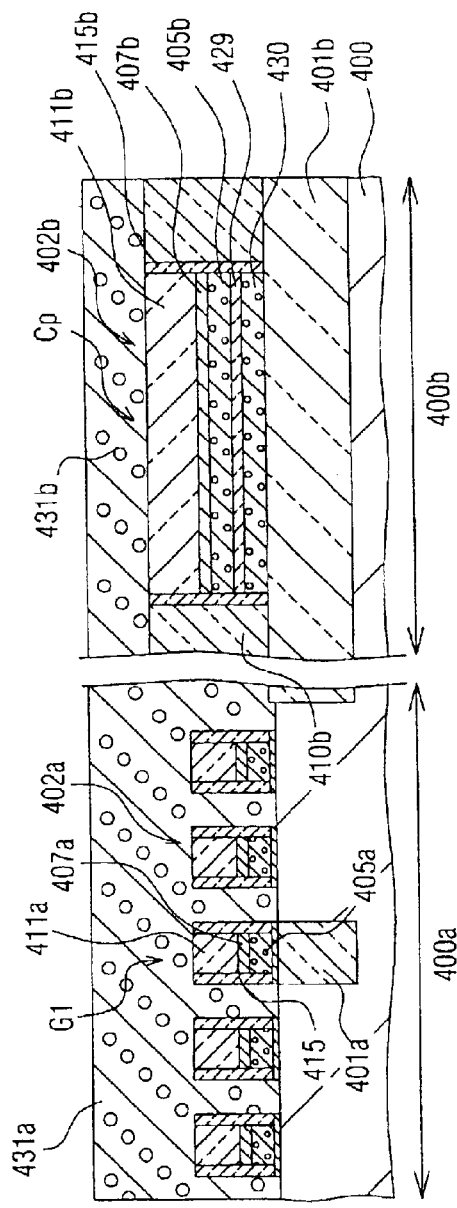
Figure 8E:
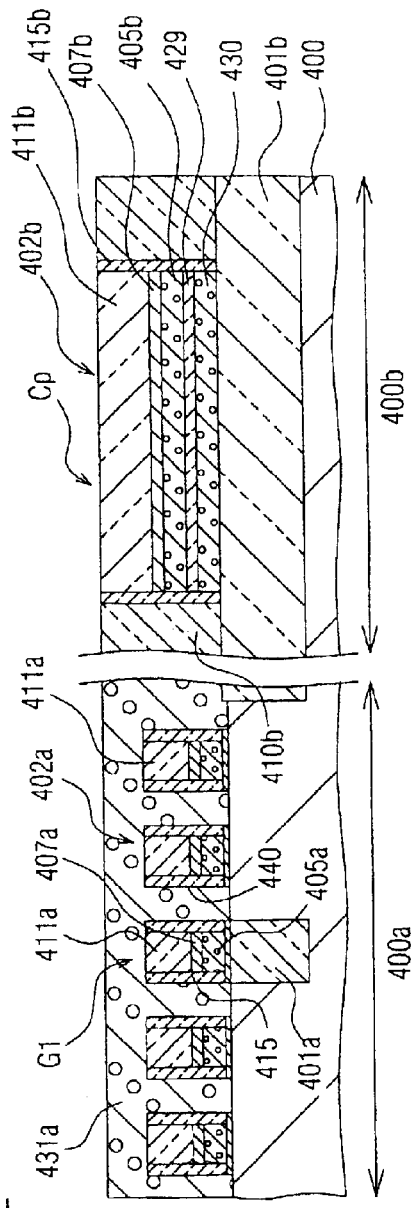

Processes of forming the structure shown in FIG. 6D will be described. A through oxide film of 2 nm in thickness is formed on the silicon substrate 300 by thermal oxidation at 750° C. Thereafter, in the NMOS region. As ions for forming an extension region are implanted under the conditions of an acceleration energy of 7 keV and a dose of $2.0 \times 10^{15}$ cm$^{-2}$. Thereafter, B ions for forming a pocket implantation region are implanted under the conditions of an acceleration energy of 10 keV and a dose of $4.0 \times 10^{13}$ cm$^{-2}$.

In the PMOS region, B ions for forming an extension region are implanted under the conditions of an acceleration energy of 2 keV and a dose of $1.0 \times 10^{15}$ cm$^{-2}$. Thereafter, As ions for forming a pocket implantation region are implanted under the conditions of an acceleration energy of 100 keV and a dose of $4.0 \times 10^{13}$ cm$^{-2}$. Thereafter, a silicon nitride film of 20 nm in thickness and a silicon oxide film of 30 nm in thickness are deposited. The silicon nitride film and silicon oxide film are-anisotropically etched to leave spacer films 315a and 315c on the side walls of the lamination structural bodies G1 and G3. In this case, the anisotropic etching process is performed by covering the flash memory cell part 300b with a resist mask in order to prevent the extension region in the flash memory cell part 300b from being silicidated in the later process.

Next, in the NMOS region, P ions for forming source/drain regions are implanted under the conditions of an acceleration energy of 15 keV and a dose of $5.0 \times 10^{15}$ cm$^{-2}$. In the PMOS region, B ions are implanted under the conditions of an acceleration energy of 5 keV and a dose of $2.0 \times 10^{15}$ cm$^{-2}$. The resist mask is thereafter removed. A heat treatment is performed by RTA for 3 seconds at 1025° C. to form source/drain regions 325a and 325c.

Next, a cobalt metal layer of 10 nm in thickness is formed on the silicon substrate 300, for example, by sputtering. Then, an annealing process is performed for 30 seconds at 500° C. to silicidate the surface layers of the source/drain regions 325a and 325b formed in the SRAM cell part 300a and logic circuit part 300c. An unreacted cobalt metal layer is selectively removed, and thereafter annealing is performed for 30 seconds at 840° C. With these processes, cobalt silicide layers 317a and 317c are formed on surface layers of the source/drain regions 325a and 325c in the SRAM cell part 300a and logic circuit part 300c.

Similar to the semiconductor device manufacture processes of the second embodiment, a resist mask is formed which covers the SRAM cell part 300a and logic circuit part 300c and has an opening above the flash memory cell part 300b. By using this resist mask, the silicon nitride film and silicon oxide film formed in the flash memory cell part 300b are anisotropically etched and removed to leave spacer films 315b on the side walls of the lamination structural body G2, as shown in FIG. 6D. The resist mask is thereafter removed.

As shown in FIG. 6E, an interlayer insulating film (silicon oxide film) 332 is deposited to a thickness of 500 nm on the whole surface of the silicon substrate 300 by plasma CVD. This interlayer insulating film 332 is formed under the conditions that it covers the lamination structural bodies G1 to G3 and the surface of the film 332 becomes generally flat.

The interlayer insulating film 332 is polished from its upper surface by CMP under the conditions that provide a selectivity relative to the silicon nitride film. As shown in FIG. 6F, this polishing stops when the upper surfaces of the offset insulating films 311a to 311c are exposed. Since the upper surfaces of the offset insulating films 311a to 311c were made flush at the preceding process, the upper surfaces of the offset insulating films are exposed generally at the same time. An over-etch amount can be reduced. In this state, the upper surfaces of the offset insulating films 311a, 311b and 311c are almost flush with the upper surfaces of the spacer films 315a, 315b and 315c.

If the upper surface of the offset insulating film 311b in the flash memory cell part 300b was etched lower than the upper surface of the offset insulating film 311a or 311c, a portion of the interlayer insulating film 332 is left on the offset insulating film 311b. However, no practical problem occurs at the later processes.

Thereafter, processes similar to those of the second embodiment described with reference to FIGS. 5F to 5I are performed.

According to the semiconductor techniques of this modification, the higher offset insulating film is etched after the offset insulating films are deposited to make the heights of the offset insulating films uniform in the substrate plane. Therefore, the plug electrode material for the SAC structure is not left on the interlayer insulating film even if the SRAM cell part, the flash memory cell part including the SAC structure and the logic circuit part including logical circuits are formed on the same substrate. The plug electrodes are not electrically shorted.

In the semiconductor techniques of this modification, before the planarizing process for the interlayer insulating film, different heights of the insulating films in respective element regions are made equal and then the lamination structures such as gates are formed. In place of these processes, the processes described hereinunder may be used.

As described in the semiconductor techniques according to the modification of the first embodiment, first the lamination structures including the offset insulating films are formed after the state shown in FIG. 5A. Next, an interlayer insulating film is formed. The interlayer insulating film is polished down to the upper surface of the highest offset insulating film under the conditions capable of selectively polishing silicon oxide relative to silicon nitride. Then, the conditions are changed to the conditions capable of polishing or etching silicon nitride and silicon oxide at the same time, to polish or etch the interlayer insulating film and offset insulating films down to the upper surface of the lowest offset insulating film and obtain the structure shown in FIG. 6F. Thereafter, processes similar to those of this modification are performed.

In each of the above-described embodiments, three different types of elements are formed on the same substrate. Two or four or more different types of elements may also be formed on the same substrate. Also in this case, by making the heights of the upper surfaces of offset insulating films equal to each other, the upper surfaces of the interlayer insulating film and offset insulating films can be made flush with each other.

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device, comprising steps of:

(a) preparing a semiconductor substrate with first and second regions being defined in a principal surface of the semiconductor substrate;

(b) forming a first underlying film in said second region of said semiconductor substrate;

(c) forming a first conductive film on said first region and said first underlying film;

(d) forming a first insulating film on said first conductive film;

(e) patterning at least two layers including said first conductive film and said first insulating film to leave a first lamination structure on said semiconductor substrate in said first region and a second lamination structure on said first underlying film in said second region, said first lamination structure being made of a portion of said first conductive film and a portion of said first insulating film stacked one upon the other, and said second lamination structure being made of a portion of said first conductive film and a portion of said first insulating film; and (f) thinning said second lamination structure so that an upper surface of said second lamination structure becomes flush with or lower than an upper surface of said first lamination structure.

2. A method of manufacturing a semiconductor device according to claim 1, further comprising steps of:

(g) forming an interlayer insulating film on the principal surface of said semiconductor substrate, said interlayer insulating film covering said first and second lamination structures;

(h) thinning said interlayer insulating film until the upper surface of said first lamination structure is exposed, an upper surface of the thinned interlayer insulating film having a flat surface;

(i) forming a plurality of contact holes through said interlayer insulating film in said first region;

(j) forming a second conductive film on said interlayer insulating film, said first lamination structure and said second lamination structure, said second conductive film being filled in said contact holes; and (k) thinning said second conductive film until the upper surface of said first lamination structure is exposed to lave a portion of the second conductive layer in said contact holes.

3. A method of manufacturing a semiconductor device, comprising steps of:

(a) preparing a semiconductor substrate with first and second regions being defined in a principal surface of said semiconductor substrate;

(b) forming a first underlying film in said second region of said semiconductor substrate;

(c) forming a first conductive film on said first region and said first underlying film;

(d) forming a first insulating film on said first conductive film;

(e) thinning the first insulating film in said second region so that an upper surface of said the first insulating film in the second region becomes flush with or lower than an upper surface of the first insulating film; and (f) patterning at least two layers including said first conductive film and said first insulating film to leave a first lamination structure on said semiconductor substrate in said first region and a second lamination structure on said first underlying film in said second region, said first lamination structure being made of a portion of said first conductive film and a portion of said first insulating film stacked one upon the other, and said second lamination structure being made of a portion of said first conductive film and a portion of said first insulating film.

4. A method of manufacturing a semiconductor device according to claim 3, further comprising steps of:

(g) forming an interlayer insulating film on the principal surface of said semiconductor substrate, said interlayer insulating film covering said first and second lamination structures;

(h) thinning said interlayer insulating film until the upper surface of said first lamination structure is exposed, an upper surface of said thinned interlayer insulating film having a flat surface;

(i) forming a plurality of contact holes through said interlayer insulating film in said first region;

(j) forming a second conductive film on said interlayer insulating film, said first lamination structure and said second lamination structure, said second conductive film being filled in said contact holes; and (k) thinning said second conductive film until the upper surface of said first lamination structure is exposed to lave a portion of said second conductive layer in said contact holes.

5. A method of manufacturing a semiconductor device, comprising steps of:

(a) preparing a semiconductor substrate with first and second regions being defined in a principal surface of said semiconductor substrate;

(b) forming a first underlying film in said second region of said semiconductor substrate;

(c) forming a first conductive film on said first region and said first underlying film;

(d) forming a first insulating film on said first conductive film;

(e) patterning at least two layers including said first conductive film and said first insulating film to leave a first lamination structure on said semiconductor substrate in said first region and a second lamination structure on said first underlying film in said second region, said first lamination structure being made of a portion of said first conductive film and a portion of said first insulating film stacked one upon the other, and said second lamination structure being made of a portion of said first conductive film and a portion of said first insulating film;

(f) forming an interlayer insulating film on the principal surface of said semiconductor substrate, said interlayer insulating film covering said first and second lamination structure;

(g) thinning said interlayer insulating film until an upper surface of said second lamination structure is exposed, under a first thinning condition that a ratio of a thinning speed of said first insulating film to a thinning speed of said interlayer insulating film is larger than 1; and (h) thinning said interlayer insulating film and said second lamination structure until an upper surface of said first lamination structure is exposed, under a second thinning condition without polishing selectivity.

6. A method of manufacturing a semiconductor device according to claim 5, further comprising steps of:

(i) forming a plurality of contact holes through said interlayer insulating film in said first region;

(j) forming a second conductive film on said interlayer insulating film, said first lamination structure and said second lamination structure, said second conductive film being filled in said contact holes; and (k) thinning said second conductive film until the upper surface of said first lamination structure is exposed to leave a portion of said second conductive film in said contact holes.

7. A method of manufacturing a semiconductor device according to claim 1, further comprising a step of forming side wall spacers on side walls of said first and second lamination structures after said step (e).

8. A method of manufacturing a semiconductor device according to claim 5, further comprising a step of forming side wall spacers on side walls of said first and second lamination structures after said step (e).

9. A method of manufacturing a semiconductor device according to claim 6, further comprising a step of forming side wall spacers on side walls of said first and second lamination structures after said step (e).

10. A method of manufacturing a semiconductor device according to claim 3, further comprising a step of forming side wall spacers on side walls of said first and second lamination structures after said step (f).

11. A method of manufacturing a semiconductor device according to claim 2, further comprising a step of forming side wall spacers on side walls of said first and second lamination structures after said step (f).

12. A method of manufacturing a semiconductor device according to claim 1, wherein said first underlying film includes a lower electrode and a dielectric film of a capacitor.

13. A method of manufacturing a semiconductor device according to claim 3, wherein said first underlying film includes a lower electrode and a dielectric film of a capacitor.

14. A method of manufacturing a semiconductor device according to claim 1, wherein said first underlying film is a lamination of a floating gate electrode and a lower electrode.

15. A method of manufacturing a semiconductor device according to claim 3, wherein said first underlying film is a lamination of a floating gate electrode and a lower electrode.

* * * * *